United States Patent
Perrott

(10) Patent No.: US 10,855,308 B2
(45) Date of Patent: Dec. 1, 2020

(54) ADAPTIVE ANALOG TO DIGITAL CONVERTER (ADC) MULTIPATH DIGITAL MICROPHONES

(71) Applicant: INVENSENSE, INC., San Jose, CA (US)

(72) Inventor: Michael Perrott, Nashua, NH (US)

(73) Assignee: INVENSENSE, INC., San Jose, CA (US)

( * ) Notice: Subject to any disclaimer, the term of this patent is extended or adjusted under 35 U.S.C. 154(b) by 0 days.

(21) Appl. No.: 16/673,484

(22) Filed: Nov. 4, 2019

(65) Prior Publication Data
US 2020/0162099 A1 May 21, 2020

Related U.S. Application Data

(60) Provisional application No. 62/769,139, filed on Nov. 19, 2018.

(51) Int. Cl.
| | |
|---|---|
| *H03M 3/00* | (2006.01) |
| *H03M 1/06* | (2006.01) |
| *H04R 3/00* | (2006.01) |
| *H03G 3/30* | (2006.01) |
| *H03M 1/08* | (2006.01) |

(52) U.S. Cl.
CPC .......... *H03M 3/376* (2013.01); *H03G 3/3005* (2013.01); *H03G 3/3089* (2013.01); *H03M 1/0604* (2013.01); *H03M 1/0863* (2013.01); *H03M 3/354* (2013.01); *H04R 3/00* (2013.01)

(58) Field of Classification Search
CPC .... H03M 3/376; H03M 3/354; H03M 1/0604; H03M 1/0863; H03G 3/3005; H03G 3/3089; H03G 3/3001; H03G 3/3002; H03G 3/00; H03G 3/32; H03G 1/0088; H03G 7/007; H04R 3/00; H04R 23/004; H04R 19/04; H04R 1/04; H04R 1/005; H04H 30/04
USPC ......................................... 381/107, 111, 104
See application file for complete search history.

(56) References Cited

U.S. PATENT DOCUMENTS 5,389,927 A * 2/1995 Turney .................. H03M 1/182
341/138
6,249,237 B1 6/2001 Prater
(Continued)

OTHER PUBLICATIONS

Office Action dated Sep. 22, 2016 for U.S. Appl. No. 14/812,576, 23 pages.
(Continued)

*Primary Examiner* — Ahmad F. Matar
*Assistant Examiner* — Sabrina Diaz
(74) *Attorney, Agent, or Firm* — Amin, Turocy & Watson, LLP

(57) ABSTRACT

Exemplary multipath digital microphone described herein can comprise exemplary embodiments of adaptive ADC range multipath digital microphones, which allow low power to be achieved for amplifiers or gain stages, as well as for exemplary adaptive ADCs in exemplary multipath digital microphone arrangements described herein, while still providing a high DR digital microphone systems. Further non-limiting embodiments can comprise an exemplary glitch removal component configured to minimize audible artifacts associated with the change in the gain of the exemplary adaptive ADCs.

26 Claims, 14 Drawing Sheets

(56) References Cited

U.S. PATENT DOCUMENTS

| | | | |
|---|---|---|---|
| 6,255,974 B1* | 7/2001 | Morizio | H03M 3/484 |
| | | | 341/118 |
| 6,333,707 B1* | 12/2001 | Oberhammer | H03M 1/188 |
| | | | 341/139 |
| 6,445,320 B1* | 9/2002 | Noro | H03M 3/49 |
| | | | 341/139 |
| 7,327,294 B2* | 2/2008 | Gierenz | H03M 1/0863 |
| | | | 341/118 |
| 9,071,267 B1 | 6/2015 | Schneider et al. | |
| 9,673,768 B2 | 6/2017 | Perrott | |
| 2003/0078007 A1* | 4/2003 | Parssinen | H03G 3/3068 |
| | | | 455/67.11 |
| 2006/0071835 A1* | 4/2006 | Inukai | H03M 3/492 |
| | | | 341/143 |
| 2006/0097899 A1* | 5/2006 | Nagai | H03M 3/48 |
| | | | 341/143 |
| 2006/0220935 A1* | 10/2006 | Hughes | H03M 1/181 |
| | | | 341/143 |
| 2008/0137784 A1* | 6/2008 | Krone | H03G 3/3068 |
| | | | 375/345 |
| 2008/0272950 A1* | 11/2008 | Eastty | H03M 1/187 |
| | | | 341/157 |
| 2009/0161883 A1 | 6/2009 | Katsianos | |
| 2011/0026739 A1 | 2/2011 | Thomsen et al. | |
| 2011/0029109 A1 | 2/2011 | Thomsen et al. | |
| 2012/0033817 A1 | 2/2012 | Francois et al. | |
| 2012/0229316 A1* | 9/2012 | Loeda | H03G 1/0088 |
| | | | 341/143 |
| 2013/0195291 A1 | 8/2013 | Josefsson | |
| 2014/0010374 A1 | 1/2014 | Kasai et al. | |
| 2014/0086433 A1 | 3/2014 | Josefsson | |
| 2014/0133677 A1 | 5/2014 | Zerbini et al. | |
| 2014/0140538 A1 | 5/2014 | Kropfitsch et al. | |
| 2015/0124981 A1 | 5/2015 | Veneri et al. | |
| 2015/0237432 A1 | 8/2015 | Miluzzi et al. | |
| 2016/0365081 A1 | 12/2016 | Satoskar et al. | |

OTHER PUBLICATIONS

Notice of Allowance dated Feb. 3, 2017 for U.S. Appl. No. 14/812,576, 15 pages.
Notice of Allowance dated Mar. 18, 2020 for U.S. Appl. No. 16/543,276, 24 pages.
International Search Report and Written Opinion dated Jun. 25, 2020 for PCT Application No. PCT/US2019/060764, 21 pages.

* cited by examiner

ADAPTIVE ANALOG TO DIGITAL CONVERTER (ADC) MULTIPATH DIGITAL MICROPHONES

PRIORITY CLAIM

This patent application is a Non-Provisional Application that claims priority to U.S. Provisional Patent Application Ser. No. 62/769,139, filed Nov. 19, 2018, entitled "ARCHITECTURE PROPOSAL: ADAPTIVE ADC RANGE WITH TWO PATH," the entirety of which is incorporated by reference herein.

TECHNICAL FIELD

The subject disclosure relates to digital microphones and, more specifically, to multipath digital microphone implementations.

BACKGROUND

Microphones can be exposed to environments where sound levels, described on a log scale using units of decibels of sound pressure level (dB SPL), can range from very quiet (e.g., less than 25 dB SPL) to very loud (e.g., 140 dB SPL). In addition, microphones are typically required to maintain their performance over a large signal range, e.g., up to 120 dB. Simultaneously, microphones are required to exhibit very small intrinsic noise in order to make weak audio signals detectable, while they also need to handle very large audio signals without significant distortion. As a result, such requirements dictate that microphones have a very large dynamic range (DR).

Analog and digital microphones output a voltage or digital output stream, respectively, corresponding to the audio signal sensed by the microphone. The advantage of a digital microphone is that its digital output stream is relatively immune to noise and that an analog-to-digital converter (ADC) is not required to perform digital signal processing on the microphone digital output stream. However, one disadvantage of a digital microphone is that its dynamic range is often lower than what can be achieved with an analog microphone due to constraints in the power consumption that can be allocated to the microphone within many applications.

Conventional solutions for improving DR of a digital microphone can include techniques such as employing one or more of a high DR ADC or employing an automatic gain control amplifier (AGC) which can significantly lower ADC DR requirements while still meeting the desired max SPL and noise floor levels of the overall digital microphone. However, such conventional solutions can require excessively large power consumption and/or introduce troublesome artifacts. Other solutions can require specific analog front ends that are likely to suffer from low signal to noise ratio (SNR) performance or multipath approaches that, due to the combining algorithm can suffer from instantaneous saturation effects.

In addition, the ability to integrate a high DR digital microphone is desirable for implementation in devices such as mobile devices that can be exposed to a variety of widely varying SPL environments. For example, a digital microphone comprising one or more microelectromechanical systems (MEMS) acoustic sensors with a component implementing an algorithm for high DR in complementary metal oxide semiconductor (CMOS) processes can provide a low power, high DR digital microphone suitable for such mobile devices. However, as the demands for consumer electronics trends toward smaller, mobile, and more feature-rich devices, the need for a high DR, digital, feature-rich microphone continues to confront continued demand for smaller and more power efficient devices. Thus, a low-power, high DR ADC remains a challenge to providing high DR, feature-rich, and low-power compact digital microphone.

It is thus desired to provide high dynamic range digital microphones that improve upon these and other deficiencies. The above-described deficiencies are merely intended to provide an overview of some of the problems of conventional implementations, and are not intended to be exhaustive. Other problems with conventional implementations and techniques, and corresponding benefits of the various aspects described herein, may become further apparent upon review of the following description.

SUMMARY

The following presents a simplified summary of the specification to provide a basic understanding of some aspects of the specification. This summary is not an extensive overview of the specification. It is intended to neither identify key or critical elements of the specification nor delineate any scope particular to any embodiments of the specification, or any scope of the claims. Its sole purpose is to present some concepts of the specification in a simplified form as a prelude to the more detailed description that is presented later.

In a non-limiting example, an exemplary multipath digital microphone is described. The exemplary multipath digital microphone described herein can comprise exemplary embodiments of adaptive ADC range multipath digital microphones, which allow low power to be achieved for amplifiers or gain stages, as well as for exemplary adaptive ADCs in exemplary multipath digital microphone arrangements described herein, while still providing a high DR digital microphone systems.

Accordingly, an exemplary multipath digital microphone can comprise a plurality of digital audio filters, each operatively coupled to exemplary adaptive analog-to-digital converters (ADCs), configured to receive digital audio signals having different scaling factors of an associated audio signal, and configured to provide one or more of filtered digital audio signals. In addition, exemplary multipath digital microphone systems can comprise an exemplary ADC range control component configured to adjust gain of the exemplary adaptive ADCs based on a respective sound pressure level threshold being sensed in the one or more of filtered digital audio signals. Furthermore, exemplary multipath digital microphone systems can comprise one or more of gain compensation components, each associated with the one or more of filtered digital audio signals, wherein the exemplary ADC range control component is further configured to adjust gain of the one or more gain compensation components on a continuous basis to compensate for a change in the gain of the exemplary adaptive ADCs. Further non-limiting embodiments can comprise an exemplary glitch removal component configured to minimize audible artifacts associated with the change in the gain of the exemplary adaptive ADCs. In another non-limiting aspect, exemplary systems can also comprise an output component configured to transmit a digital signal associated with the digital MEMS microphone comprising one or more of a pulse-density modulation (PDM) signal, integrated interchip sound ($I^2S$) signal, or a Soundwire signal.

In a further non-limiting aspect, exemplary methods and systems associated with multipath digital microphone systems are described.

These and other embodiments are described in more detail below.

BRIEF DESCRIPTION OF THE DRAWINGS

Various non-limiting embodiments are further described with reference to the accompanying drawings, in which.

DETAILED DESCRIPTION

While a brief overview is provided, certain aspects of the subject disclosure are described or depicted herein for the purposes of illustration and not limitation. Thus, variations of the disclosed embodiments as suggested by the disclosed apparatuses, systems, and methodologies are intended to be encompassed within the scope of the subject matter disclosed herein.

According to various described embodiments, the subject disclosure provides digital microphones, systems, and methods for multipath digital microphones. In non-limiting aspects, exemplary embodiments can comprise MEMS digital sensors employing adaptive analog-to-digital conversion in the sensor signal path. As used herein, the terms adaptive ADC, and so on, can be understood to refer to one or more components that can be configured to operate and/or facilitate variable scaling factor (e.g., via a variable sampling capacitor or other component of the ADC, etc.) across the ADC from input to output that allows changing the range or gain of the ADC, depending on context. For instance, in some non-limiting examples described herein, adaptive ADC can refer to an ADC (e.g., a Sigma Delta modulator, etc.) in combination with a filter (e.g., a low pass filter, decimator, etc.) that facilitate variable scaling factor (e.g., via a variable sampling capacitor or other component of the ADC, etc.) across the ADC from input to output that allows changing the range or gain of the ADC. In other non-limiting examples, adaptive ADC can refer to or more other components (e.g., a successive approximation ADC, etc.) that facilitate variable scaling factor across the ADC from input to output that allows changing the range or gain of the ADC. As described above, a digital microphone outputs a digital output stream corresponding to an audio signal sensed by the microphone. While a digital microphone is relatively immune to noise and does not require an ADC on its output stream, the dynamic range can be lower than what can be achieved with an analog microphone under the constraints in the microphone power consumption for particular applications. As the demands for consumer electronics trends toward smaller, mobile and more feature-rich devices, the need for a high DR, digital, feature-rich microphone continues to confront continued demand for smaller and more power efficient devices.

Figure 1:
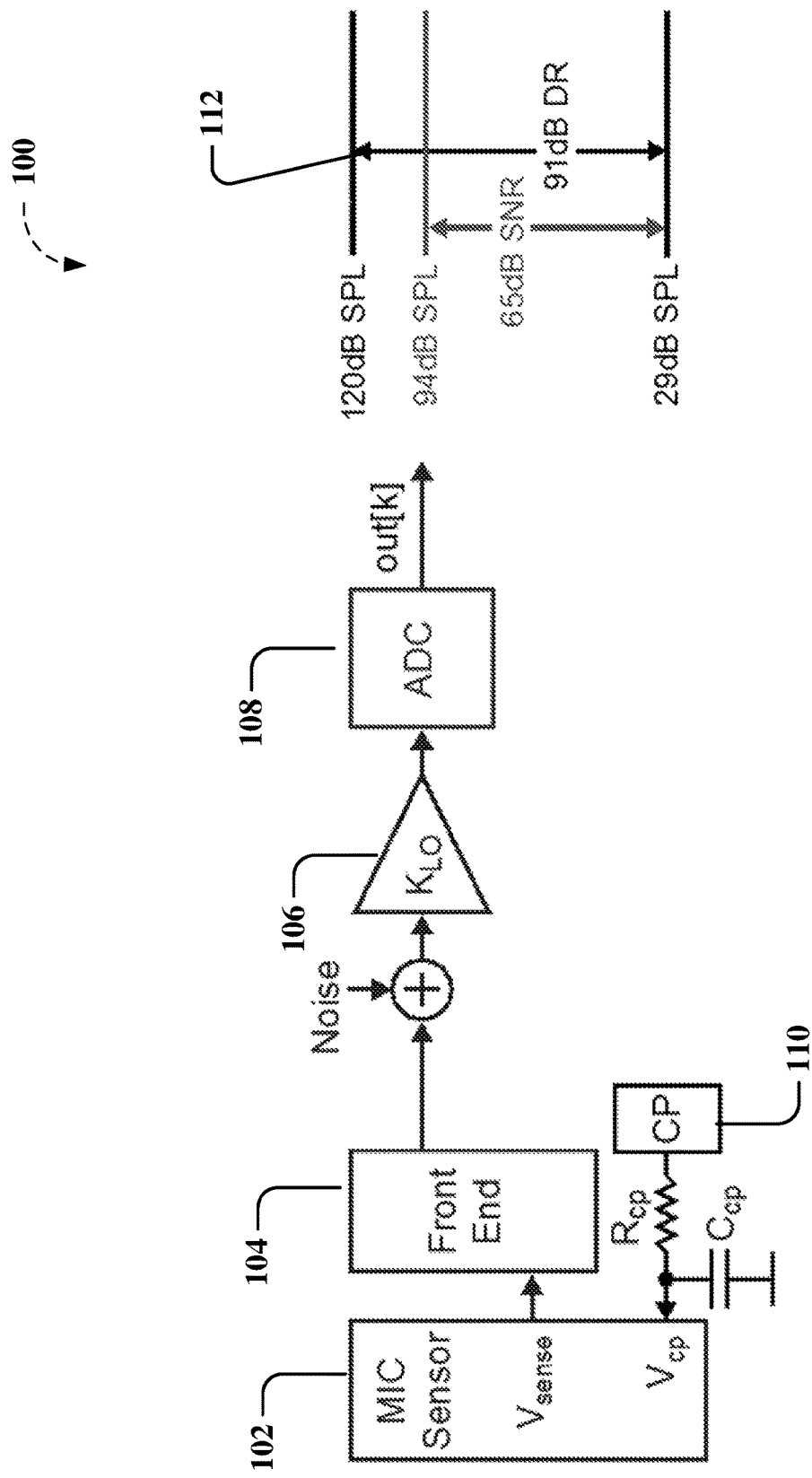
FIG. 1 depicts a functional block diagram of an exemplary operating environment suitable for incorporation of various non-limiting aspects of the subject disclosure.

FIG. 1 depicts a functional block diagram of an exemplary operating environment 100 suitable for incorporation of various non-limiting aspects of the subject disclosure. As a non-limiting example, an exemplary operating environment 100 can comprise one or more exemplary microelectromechanical systems (MEMS) acoustic or microphone sensors 102 (e.g., one or more of MEMS acoustic or microphone sensor, etc.). In various embodiments, exemplary systems are depicted as comprising one MEMS acoustic or microphone sensor 102, whereas other exemplary systems can be described as comprising more than one MEMS acoustic or microphone sensors 102. It can be appreciated that the various MEMS acoustic or microphone sensors 102 need not be identical in design, fabrication, characteristic, and/or placement, etc., and according to a non-limiting aspect, the one or more exemplary MEMS acoustic or microphone sensors 102 vary in one or more of the forgoing aspects. In a non-limiting aspect, the one or more of MEMS acoustic or microphone sensors 102 can be configured to receive one or more of the acoustic signal or a variation associated with the acoustic signal (e.g., such as the acoustic signal varied by differences in time, location, acoustic path, etc.) or can be comprised of any number of disparate transducer structures (e.g., numbers and/or configuration of membranes, etc.), any number of front end circuit designs (e.g., supplying variable charge pump voltages, etc.), etc., for example.

The one or more MEMS acoustic or microphone sensors 102 can be configured to receive one or more acoustic signals, and can be operatively coupled to one or more components or circuitry 104 (e.g., one or more components or circuitry 104, etc., sometimes referred to, herein, as, "front end") configured to process one or more electrical signals (e.g., one or more electrical signals associated with one or more of MEMS acoustic or microphone sensor, etc.) that vary in accordance with the one or more acoustic signals to create one or more corresponding processed electrical signal (e.g., at one or more outputs of the one or more components or circuitry 104, etc.).

In a further non-limiting example, an exemplary operating environment 100 can comprise one or more exemplary amplifier or gain stage 106 (e.g., one or more amplifier or gain stage 106, etc.) operatively coupled to the one or more output associated with the one or more components or circuitry 104 (e.g., one or more of components or circuitry 104, etc.). In a non-limiting aspect, the one or more amplifier or gain stage 106 can be configured to receive the one or more corresponding processed electrical signals and/or apply one or more scaling factors (e.g., one or more analog scaling factors) to the one or more corresponding processed electrical signals, for example, as further described herein, regarding FIGS. 3-4.

Figure 4:
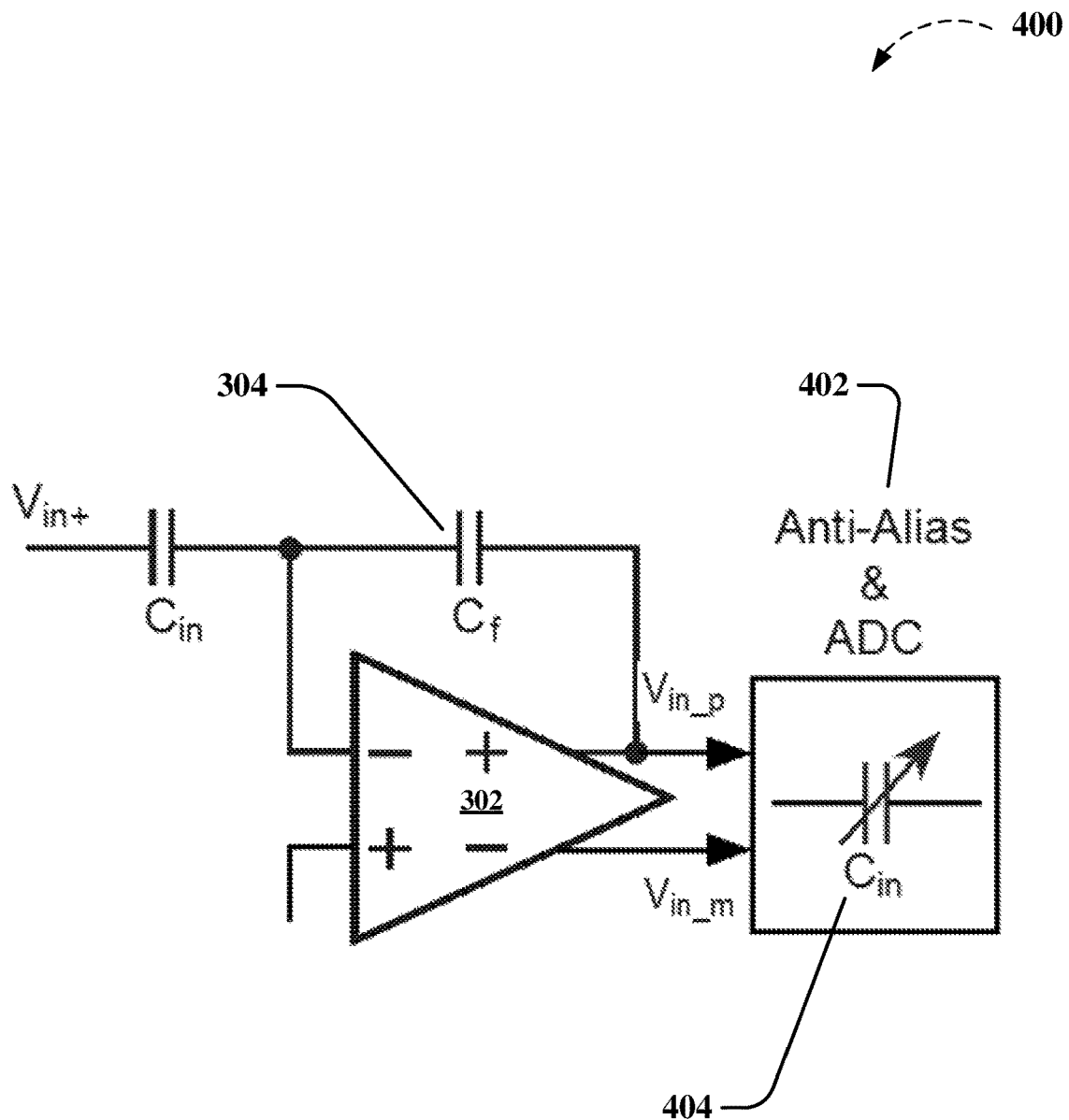
FIG. 4 depicts a functional block diagram of an exemplary implementation of adaptive analog to digital converter (ADC) according to further non-limiting aspects of the subject disclosure.
Figure 5:
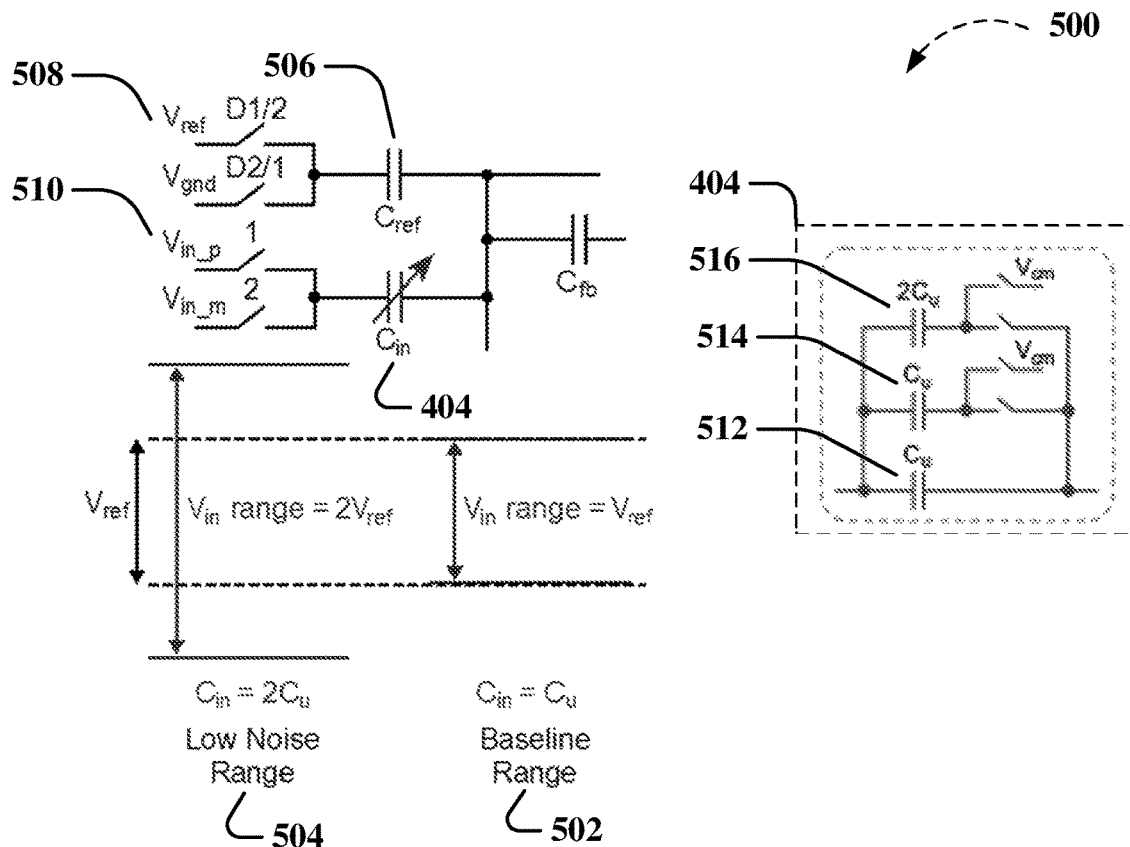
FIG. 5 depicts another functional block diagram illustrating exemplary aspects of an adaptive ADC according to further non-limiting aspects of the subject disclosure.
Figure 5:
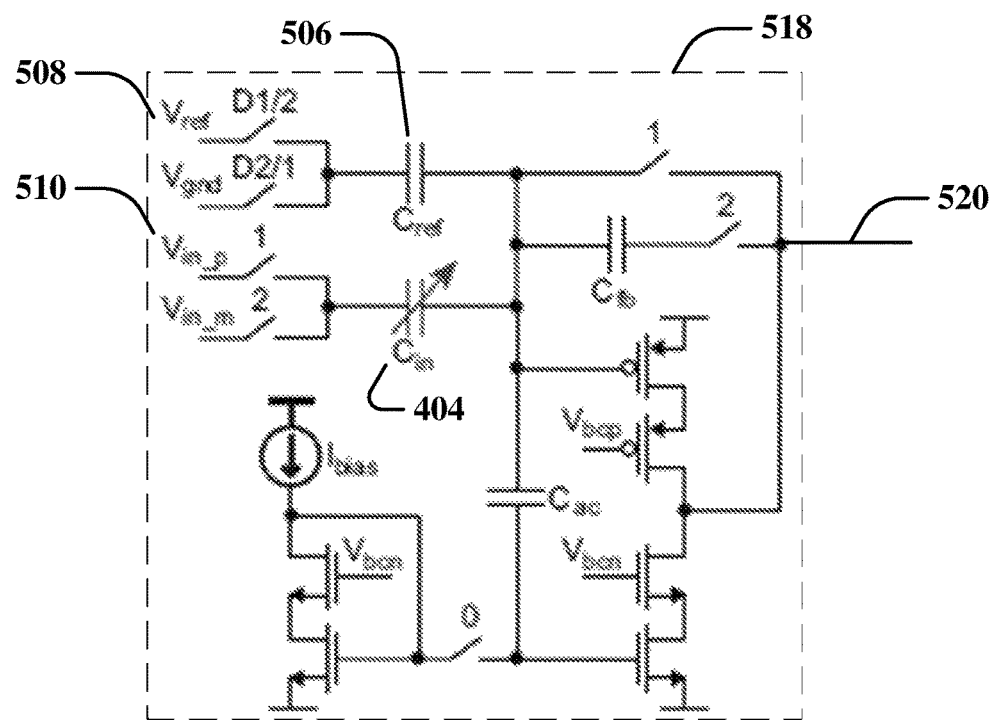

In addition, exemplary operating environment 100 can further comprise one or more exemplary ADCs 108 (e.g., one or more adaptive ADCs, etc.) operatively coupled to one or more outputs associated with the one or more amplifier or gain stage 106, as further described herein, regarding FIGS. 4-5. In another non-limiting aspect, the one or more exemplary ADCs 108 can be configured to provide one or more digital audio signals having different digital scaling factors associated with the one or more acoustic signals (e.g., at outputs associated with the one or more ADCs 108, etc.). In a further non-limiting aspect, the one or more components or circuitry 104 can comprise or be associated with one or more adjustable direct current (DC) bias voltage circuit operatively coupled to the one or more of MEMS acoustic or microphone sensors 102 and can be configured to adjust one or more DC bias voltage provided to the one or more of MEMS acoustic or microphone sensors 102, respectively, e.g., via one or more charge pump 110.

As depicted in FIG. 1, it can understood that noise in an RC circuit employing sampling is limited by the kT/C noise, such as resulting from the cap capacitance associated with the one or more ADC 108. It can be further understood that the ADC (e.g., one or more ADCs 108) is a significant power consumer. To achieve a high dynamic range (e.g., max signal versus noise floor) ADC (e.g., DR of 91 decibel (dB) 112) power consumption can be expected to increase approximately four times for every two times increase in dynamic range assuming kT/C noise dominates. Accordingly, it can be shown that simply designing an ADC for larger dynamic range can lead to unacceptably high power consumption.

Figure 2:
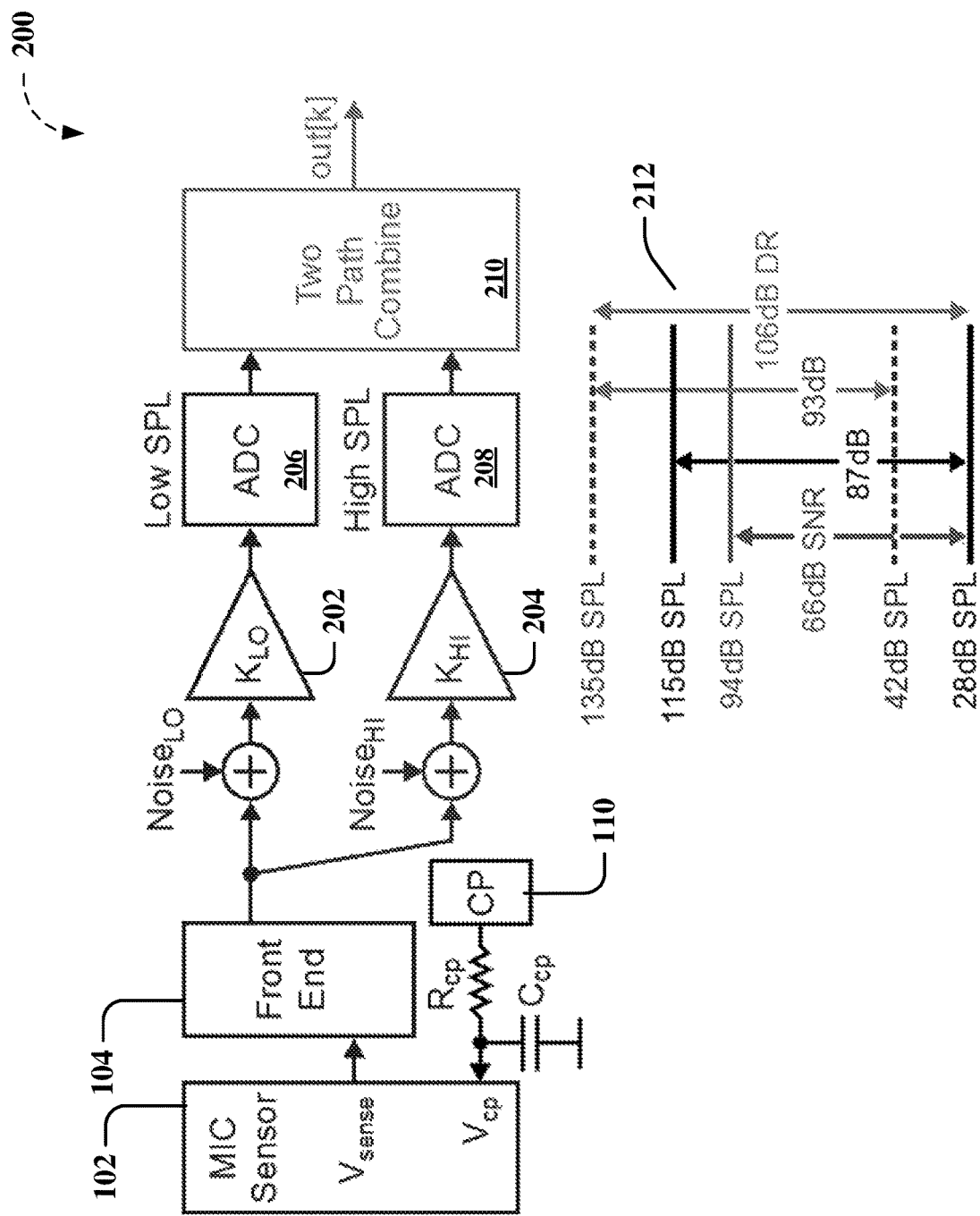
FIG. 2 depicts a functional block diagram of an exemplary digital microphone system comprising a non-limiting implementation of a two-path digital audio combiner component according to aspects of the subject disclosure.

FIG. 2 depicts a functional block diagram of an exemplary digital microphone system 200 comprising a non-limiting implementation of a two-path digital audio combiner component according to aspects of the subject disclosure. U.S. Pat. No. 9,673,768 describes multipath digital microphone systems comprising a multipath digital audio combiner component, the entirety of which is herein incorporated by reference. As a non-limiting example, FIG. 2 depicts a functional block diagram of an exemplary digital microphone system 200 comprising a non-limiting implementation of a two-path digital combiner audio combiner component 210 according to aspects of the subject disclosure. For instance, as described above regarding FIG. 1, exemplary digital microphone system 200 can comprise one or more exemplary MEMS acoustic or microphone sensors 102 (e.g., one or more MEMS acoustic or microphone sensor 102, etc.), operatively coupled to one or more components or circuitry 104 (e.g., one or more components or circuitry 104, etc.), or front end, one or more exemplary amplifiers or gain stages 106 (e.g., one or more of amplifiers or gain stages 106, etc.) operatively coupled to the one or more output associated with the one or more components or circuitry 104 (e.g., one or more components or circuitry 104, etc.), one or more exemplary ADCs 108 (e.g., one or more ADC 108, etc.) operatively coupled to one or more outputs associated with the one or more amplifiers or gain stages 106. In addition, exemplary digital microphone system 200 can further comprise an exemplary multipath digital audio combiner component 210 operatively coupled to one or more outputs associated with the one or more ADCs 108 (e.g., outputs associated with the one or more ADC 108, etc.).

As a further non-limiting example in FIG. 2, exemplary digital microphone system 200 is depicted as digital two-path microphone system that can employ a single MEMS acoustic or microphone sensor 102 and a single front end 104 coupled to a Low SPL path (e.g., comprising exemplary amplifier or gain stage 202 and exemplary ADC 206) and a High SPL path (e.g., comprising exemplary amplifier or gain stage 204 and exemplary ADC 208), with the outputs of exemplary ADC 206 and ADC 208 coupled to exemplary multipath digital audio combiner component 210, which provides an exemplary path combiner output, out[k]. In a non-limiting aspect, the Low SPL path can have a gain value, $K_{LO}$, chosen to meet the desired noise floor for low audio signals, and the High SPL path can have a gain value, $K_{HI}$, chosen to meet the Max SPL level required of the overall digital microphone. In a further non-limiting aspect, the value of $K_{LO}$ can be greater than the value of $K_{HI}$. In addition, unlike in an AGC approach (e.g., adjusting analog scaling factors prior to the ADC), these gain values, $K_{HI}$ and $K_{LO}$, are described in U.S. Pat. No. 9,673,768 as nominally static rather than varying according to the input signal levels (though their values may be changed under different operating modes of the digital microphone) and/or can incorporate aspects of an AGC approach, in a further non-limiting aspect. For instance, rather than changing a gain value according to the input audio signal level as done in AGC systems, an exemplary multipath digital audio combiner component 210, as described in U.S. Pat. No. 9,673,768, can be configured to select an ADC output from the Low SPL path or the High SPL path according to an input audio signal level.

As a further non-limiting example, for small input audio signal levels, the Low SPL path output can be chosen (e.g., by exemplary multipath digital audio combiner component 210 or portions thereof) for output to exemplary path combiner output, out[k], but when the input audio signal level is close to exceeding the Max SPL range of the Low SPL path, exemplary multipath digital audio combiner component 210 can be further configured to select the High SPL path for output to exemplary path combiner output, out[k].

In the non-limiting example shown in FIG. 2, it is assumed that the High SPL path ADC (e.g., exemplary ADC 208) is designed to have worse noise than the Low SPL path ADC (e.g., exemplary ADC 206), which allows the High SPL path ADC (e.g., exemplary ADC 208) to be implemented with significantly lower power consumption than the Low SPL path ADC (e.g., exemplary ADC 206). However, due to the higher ADC noise and reduced amplifier gain in the High SPL path (e.g., exemplary ADC 206), the noise floor increases when sending the High SPL path (e.g., comprising exemplary amplifier or gain stage 204 and exemplary ADC 208) to the overall microphone output (e.g., exemplary path combiner output, out[k]) rather than the Low SPL path Low SPL path (e.g., comprising exemplary amplifier or gain stage 202 and exemplary ADC 206). It can be understood that this increase in noise floor will be acceptable for many audio applications since the High SPL path (e.g., comprising exemplary amplifier or gain stage 204 and exemplary ADC 208) is only activated when large audio signals occur. Thus, the overall digital microphone as depicted regarding exemplary digital microphone system 200 is able to achieve a large DR 212 without requiring a large DR ADC, which, in turn, enables a relatively low power digital microphone implementation that can achieve similar DR, for example, as an analog microphone as described in U.S. Pat. No. 9,673,768.

Thus, FIG. 2 depicts employing two relatively lower performance ADCs to cover the specified dynamic range, wherein for small signals, the Low SPL path (e.g., comprising exemplary amplifier or gain stage 202 and exemplary ADC 206) provides required SNR performance, and wherein for large signals, the High SPL path (e.g., comprising exemplary amplifier or gain stage 204 and exemplary ADC 208) path provides required range (e.g., limited by MEMS 102 and front end 104). It can be appreciated that the High SPL path (e.g., comprising exemplary amplifier or gain stage 204 and exemplary ADC 208) consumes much less power/area since allowable or tolerable noise can be higher. However, further improvements on power reduction can be desirable, while maintaining high DR ADC.

Figure 3:
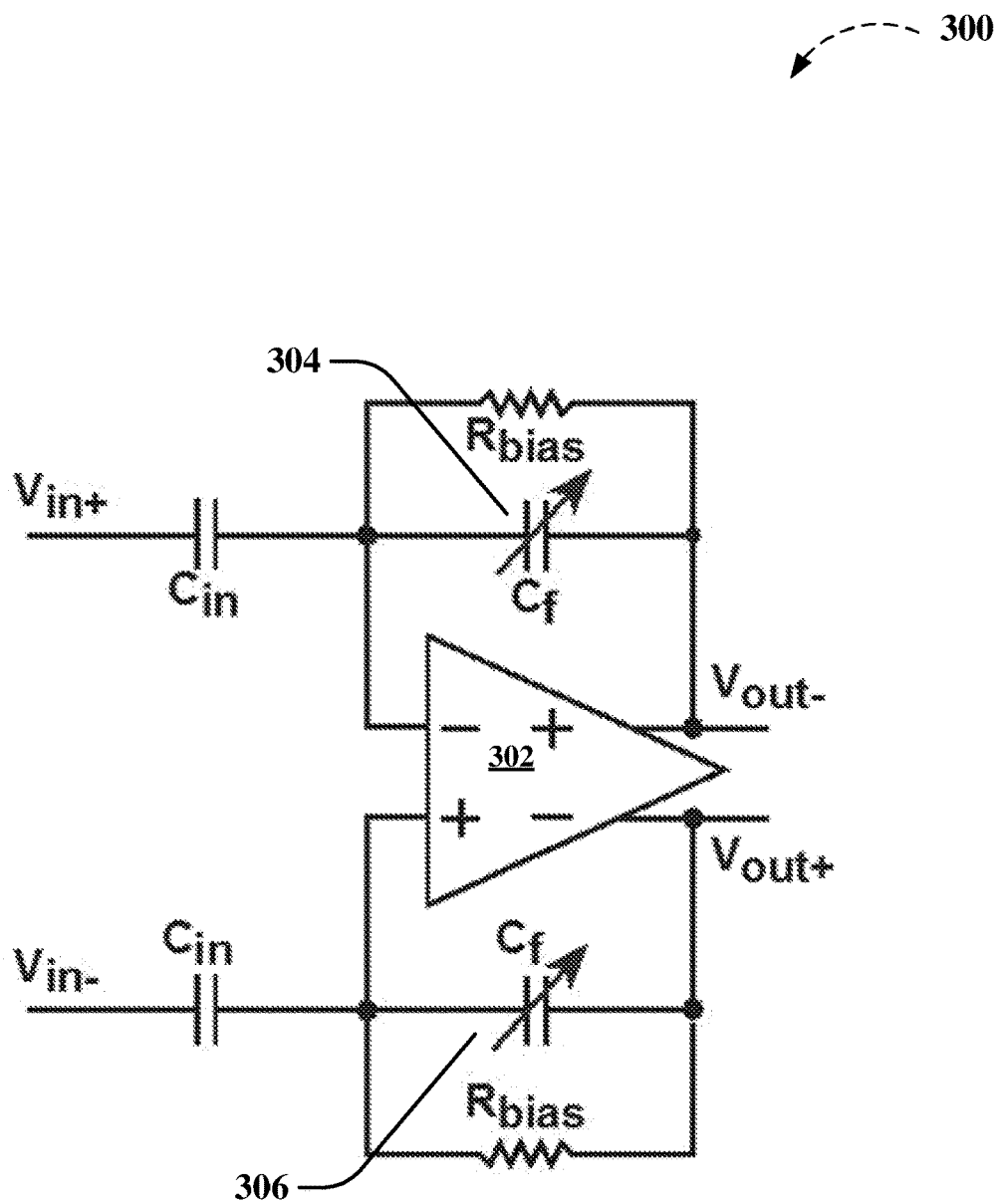
FIG. 3 depicts a functional block diagram of an exemplary low-power gain stage according to further non-limiting aspects of the subject disclosure.

FIG. 3 depicts a functional block diagram of an exemplary low-power gain stage 300 according to further non-limiting aspects of the subject disclosure. Various non-limiting embodiments as described herein can employ exemplary low-power gain stage 300. For instance, exemplary low-power gain stage 300 can comprise exemplary amplifier 302, with a capacitive-based feedback network comprising exemplary feedback capacitors 304 and 306. It can be understood that while switching response for capacitive-based feedback network amplifier can be relatively slower than a resistance-based feedback network amplifier, due to settling attributable to AC coupling, exemplary low-power gain stage 300 employing a capacitive-based feedback network amplifier can result in lower power consumption than one employing a resistance-based feedback network amplifier.

Accordingly, FIG. 4 depicts a functional block diagram of an exemplary implementation of adaptive ADC 400 according to further non-limiting aspects of the subject disclosure. Various non-limiting embodiments can employ exemplary low-power gain stage 300 and exemplary implementation of adaptive ADC 400, for example, as further described herein. According to a non-limiting aspect, desired gain change or scaling factors can be performed within an ADC, rather than with AGC, which allows use of low-power capacitive-based feedback network amplifiers, rather than a relatively higher power AGC gain adjustment scheme. Accordingly, an exemplary implementation of adaptive ADC 400 can comprise or be associated with exemplary amplifier 302, employing a capacitive-based feedback network comprising exemplary feedback capacitors (e.g., one or more of exemplary feedback capacitors 304 and 306, etc.). In a further non-limiting aspect, an exemplary implementation of adaptive ADC 400 can comprise or be associated with anti-aliasing 402 and exemplary adaptive ADC, employing a variable input sampling capacitance 404 network, as further described herein example, regarding FIG. 5. While for purposes of illustration, exemplary gain stages comprising or associated with exemplary amplifier 302 is depicted or described as employing a variable capacitive-based feedback network comprising exemplary feedback capacitors (e.g., one or more of exemplary feedback capacitors 304 and 306, etc.), it can be understood that the various non-limiting embodiments described herein are not so limited. For instance, as depicted in FIG. 4, feedback capacitor 304 can comprise a fixed capacitance value.

For instance, in a non-limiting aspect, exemplary amplifier 302, employing a capacitive-based feedback network comprising exemplary feedback capacitors (e.g., one or more of exemplary feedback capacitors 304 and 306, etc.), can comprise a fixed gain, wherein adaptive ADCs as described herein can be configured to be gain adjusted by an exemplary ADC range control component (not shown) via a change from one input sampling capacitance value of to another input sampling capacitance value (e.g., according to an ADC range control algorithm, etc.). As a further example, for a baseline range defined as $C_{in}=C_u$, it can be expected that the noise will decrease as indicated in FIG. 4 for a doubling of $C_{in}=2C_u$, for a low noise range, for example, as further described regarding FIG. 5.

FIG. 5 depicts another functional block diagram 500 illustrating exemplary aspects of an adaptive ADC according to further non-limiting aspects of the subject disclosure. For instance, FIG. 5 depicts portions of an exemplary adaptive ADC comprising variable input sampling capacitance 404. As can be seen in FIG. 5, for a baseline range 502 defined as $C_{in}=C_u$, it can be expected that the noise will decrease as indicated in FIG. 4, for a doubling of $C_{in}=2C_u$, for a low noise range 504, for example, by virtue of changing input sampling capacitance 404. Thus, FIG. 5 depicts an exemplary variable input sampling capacitance 404 network including a reference capacitor $C_{ref}$ 506, whereby $V_{ref}$ 508 is used to compare $V_{in}$ 510 to $V_{ref}$ 508 in an exemplary adaptive ADC. For instance, adaptive ADCs as described herein can be configured to be gain adjusted by an exemplary ADC range control component (not shown) via a change from one input sampling capacitance value of to another input sampling capacitance value (e.g., according to an ADC range control algorithm, etc.), sometimes referred to herein as a variable sampling capacitor or variable input sampling capacitor. Accordingly, FIG. 5 illustrates an exemplary embodiment of a variable sampling capacitor or variable input sampling capacitor comprising a network of capacitors 512, 514, 516 in a switched network arrangement that can be employed in various embodiments to facilitate changing input sampling capacitance value 404 via an exemplary ADC range control component (not shown).

In a non-limiting example, changing input sampling capacitance 404 to a larger input sampling capacitance value 404 lowers kT/C noise of an exemplary adaptive ADC, which can increase signal to noise (SNR), and allows over-ranging an exemplary adaptive ADC with larger signals. In another non-limiting example, changing input sampling capacitance 404 to a smaller input sampling capacitance value 404 increases kT/C noise of an exemplary adaptive ADC, which can reduce SNR, and avoids over-ranging an exemplary adaptive ADC with larger signals. It can be understood that, while the exemplary embodiments of FIGS. 4 and 5, depict corresponds to two level of ADC gain control of an exemplary adaptive ADC, the disclosed subject matter is not so limited. For instance, the levels of ADC gain control afforded by employing exemplary adaptive ADC comprising variable input sampling capacitance 404 could be extended to more than two levels by increasing the number of values of the variable input sampling capacitance 404.

Thus, FIG. 5 depicts further non-limiting aspects of an exemplary adaptive ADC embodiment employing variable input sampling capacitance 404 network and reference capacitor $C_{ref}$ 506 with a discrete-time integrator that employs an inverter-based amplifier configuration, and which can facilitate providing instantaneous discrete-time gain changes across the exemplary adaptive ADC, as described herein. As shown, FIG. 5 depicts a first stage 518 of a single-bit, discrete-time Delta-Sigma ADC employing the variable input sampling capacitance 404 network as well as a discrete-time integrator utilizing an inverter-based amplifier that can facilitate providing instantaneous discrete-time gain changes across an exemplary adaptive ADC, as described herein, for the purposes of illustration and not limitation. As can be understood, generally, a discrete-time Delta-Sigma ADC can comprise multiple stages of discrete-time integrators, according to the order of the Delta-Sigma ADC (e.g., orders greater than or equal to 1, with typical values in the range of 2 to 4), wherein the first stage of the ADC typically sets the noise performance of the overall ADC, and is therefore the most relevant in illustrating exemplary aspects of adaptive ADC, as described herein. Accordingly, in a further non-limiting aspect, output 520 of the first stage 518 of the exemplary adaptive ADC can be fed forward into further integrator stages (not shown), which can employ further variable capacitance configurations on the additional integrator stages' inputs, as further described herein. Thus, depicted in FIG. 5 is but one example of non-limiting aspects of an exemplary adaptive ADC configured as a discrete-time Delta-Sigma with single bit, single-ended output that includes discrete-time integrators utilizing inverter-based amplifier configurations, according to non-limiting aspects. In other non-limiting aspects, exemplary adaptive ADC can employ different circuit configurations to facilitate providing instantaneous discrete-time gain changes across the exemplary adaptive ADC, as described herein, including, but not limited to different amplifier configurations such as differential or other amplifier configurations, different switching schemes, multi-bit adaptive ADC implementations, successive approximation ADC configurations, multiple reference capacitors $C_{ref}$ 506 (e.g., in the case of a multi-bit ADC implementation) employed in the first stage of the Delta Sigma ADC, etc.

Figure 6:
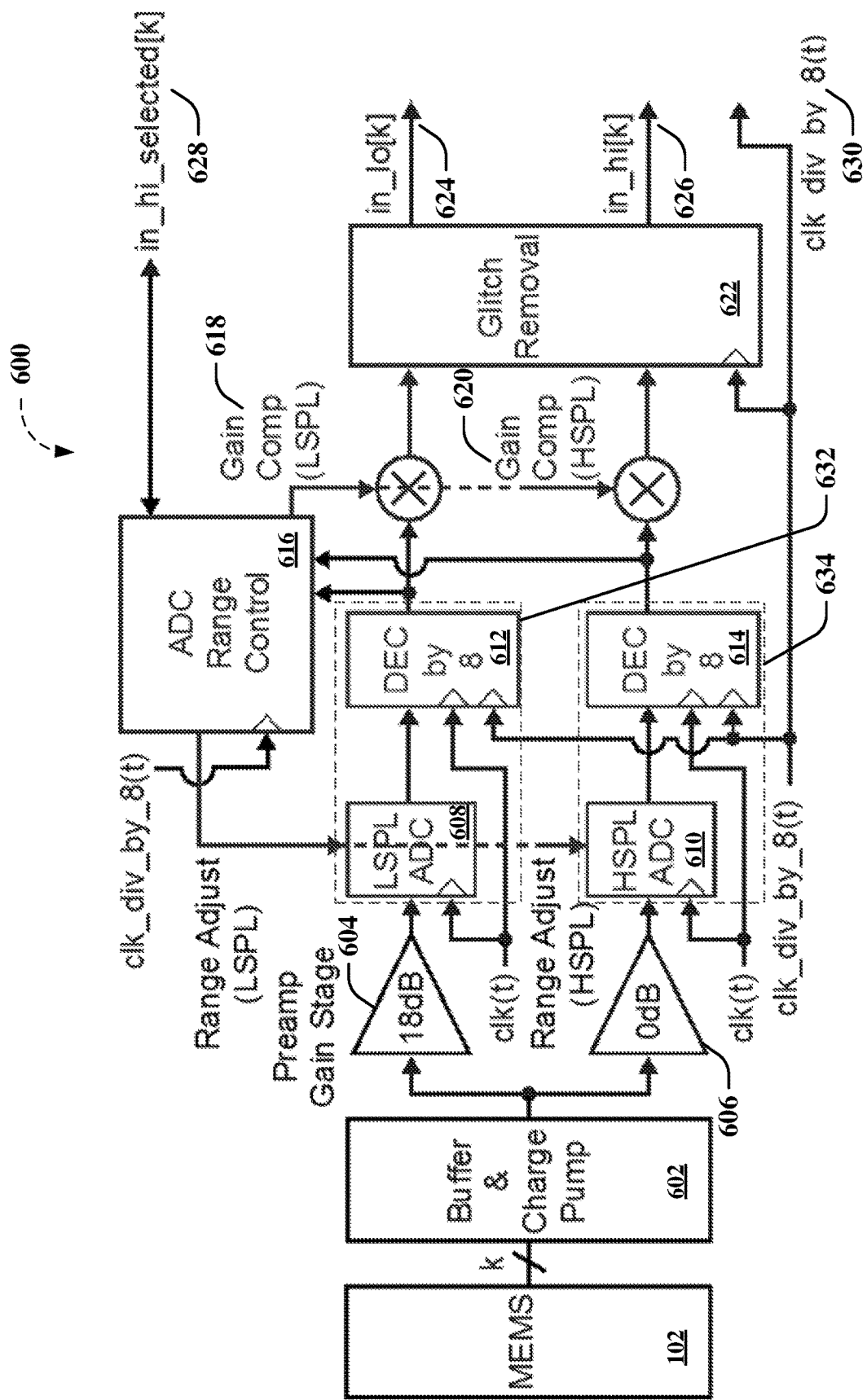
FIG. 6 depicts a functional block diagram illustrating exemplary aspects of an adaptive ADC range multipath digital microphone system according to non-limiting aspects of the subject disclosure.
Figure 7:
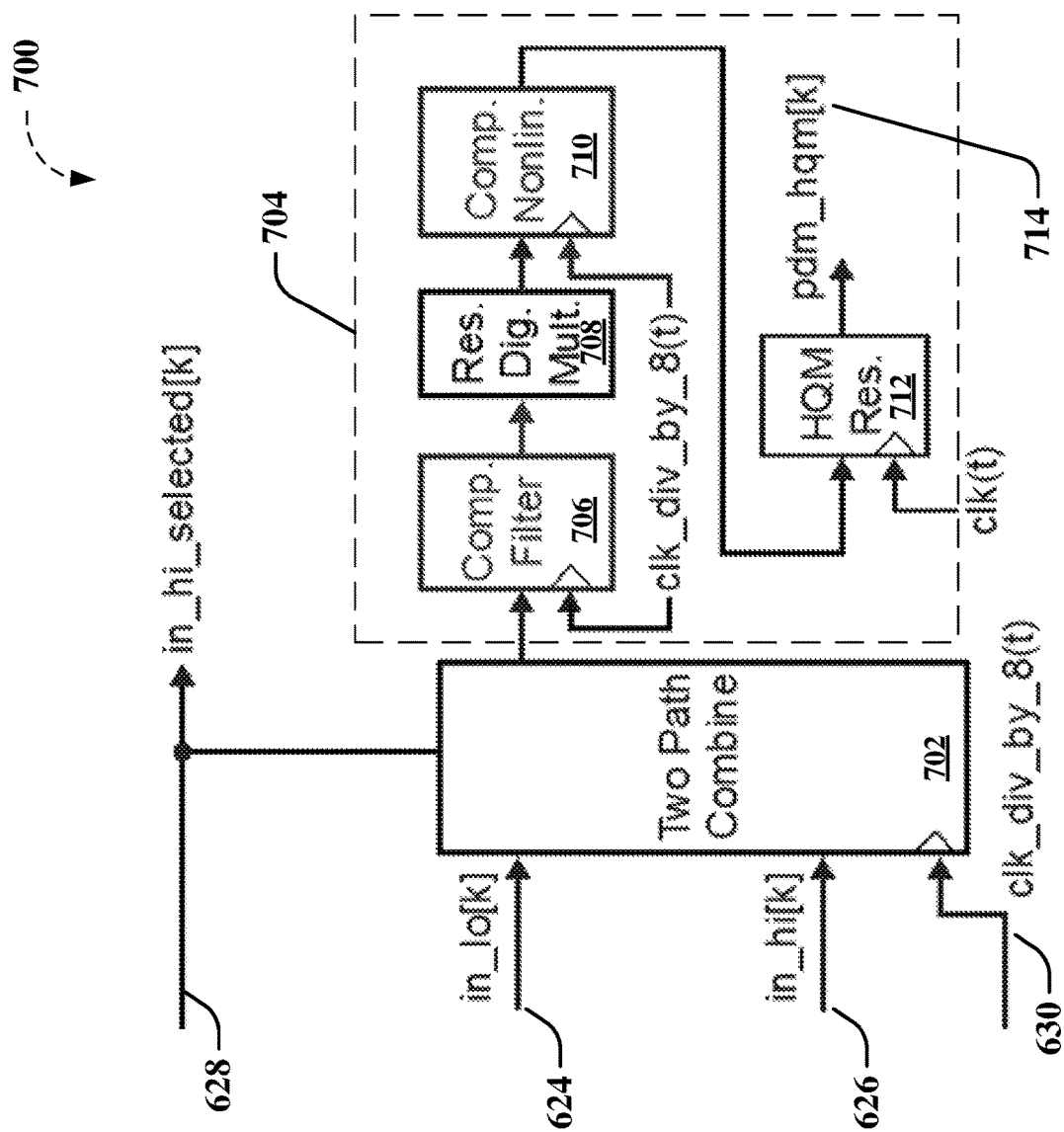
FIG. 7 depicts another functional block diagram illustrating exemplary aspects of an adaptive ADC range multipath digital microphone system according to further non-limiting aspects of the subject disclosure.

Accordingly, various non-limiting embodiments as described herein can combine exemplary adaptive ADCs as described herein with exemplary multipath digital microphone concepts described herein, regarding FIG. 2, for example. Thus, FIGS. 6-7 illustrate an exemplary embodiment of adaptive ADC range multipath digital microphones, according to various embodiments described herein. For instance, FIG. 6 depicts a functional block diagram 600 illustrating exemplary aspects of an adaptive ADC range multipath digital microphone system according to non-limiting aspects of the subject disclosure. In a non-limiting aspect, exemplary embodiments of adaptive ADC range multipath digital microphones allows low power to be achieved for amplifiers or gain stages, for example, as described above regarding FIGS. 3-4, and exemplary adaptive ADCs, for example, as described above regarding FIGS. 4-5. This is due in part due to the ability to employ a capacitive feedback structure in the gain stage, resulting in gain stage power saving, in addition to the power savings available from employing multipath adaptive ADCs, which allows employing lower power ADC since its noise impact is reduced, as described herein. In a further non-limiting aspect, exemplary embodiments of adaptive ADC range multipath digital microphones configured in exemplary multipath digital microphone arrangements described herein, regarding FIG. 2, for example, and as further described below regarding FIG. 7.

Accordingly, exemplary adaptive ADC range multipath digital microphone system of FIG. 6 is depicted as digital two-path microphone system that can employ a single MEMS acoustic or microphone sensor 102 and a single front end 104 (e.g., buffer and charge pump 602) coupled to a Low SPL path (e.g., comprising exemplary low-power amplifier or gain stage 604 and exemplary adaptive ADC 608) and a High SPL path (e.g., comprising exemplary low-power amplifier or gain stage 606 and exemplary adaptive ADC 610), as further described herein.

In a non-limiting aspect, the Low SPL path can have a gain value, $K_L$, chosen to meet the desired noise floor for low audio signals, and the High SPL path can have a gain value, $K_H$, chosen to meet the Max SPL level required of the overall digital microphone. In a further non-limiting aspect, the value of $K_L$ can be greater than the value of $K_H$. In addition, unlike in an AGC approach (e.g., adjusting analog scaling factors prior to the ADC), these gain values, $K_H$ and $K_L$, as described in U.S. Pat. No. 9,673,768 can be nominally static rather than varying according to the input signal levels (though their values may be changed under different operating modes of the digital microphone) and/or can incorporate aspects of an AGC approach, in a further non-limiting aspect.

Accordingly, exemplary adaptive ADC range multipath digital microphone system of FIG. 6 can comprise one or more adaptive ADCs that can be configured to generate one of one or more digital audio signals having different scaling factors of an associated audio signal. As a non-limiting example, the one or more adaptive ADCs can be configured to be gain adjusted by the ADC range control component via a change from one of one or more input sampling capacitance values of an associated one of the one or more adaptive ADCs to another one of the one or more input sampling capacitance values of the associated one of the one or more adaptive ADCs according to an ADC range control algorithm, as further described herein. In a non-limiting aspect, another adaptive ADC of the one or more adaptive ADCs can be configured to provide a low power audio signal relative to power of the one or more digital audio signals having different scaling factors. for example, as further described herein regarding FIG. 10.

In another non-limiting aspect, the one or more adaptive ADCs that can be further configured (e.g., reduced sampling rate, reduced power amplifier, changed sampling capacitance, etc.) to be placed in a first low-power mode to provide a low-power audio signal relative to power of the one or more digital audio signals having different scaling factors, as described herein. In another non-limiting example, a low-power mode adaptive ADC of the one or more adaptive ADCs can be configured to provide a second low-power mode, wherein the one or more adaptive ADCs other than the low-power mode adaptive ADC can be further configured to be switched off to provide the second low-power mode. As further described herein, exemplary adaptive ADCs can comprise a sigma delta modulator configured as an ADCs or a successive approximation ADC, in further non-limiting aspects.

Exemplary adaptive ADC range multipath digital microphone system of FIG. 6 can further comprise one or more digital audio filters (e.g., decimation filter, low pass filter, etc.) 612 and 614, each operatively coupled to respective exemplary adaptive ADCs 608, 610 (e.g., Sigma Delta modulators), which can be configured to receive digital audio signals having different scaling factors (e.g., via exemplary adaptive ADCs 608, 610) of an associated audio signal, and can be configured to provide filtered digital audio signals, in non-limiting aspects.

Exemplary adaptive ADC range multipath digital microphone system of FIG. 6 can further comprise an exemplary ADC range control component 616, which configured to adjust gain of one or more of exemplary adaptive ADCs 608, 610, as described herein, based in part on a respective sound pressure level threshold being sensed in the digital audio signals (e.g., via one or more digital audio filters (e.g., decimation filter, low pass filter, etc.) 612 and 614) having different scaling factors, in further non-limiting aspects.

Exemplary adaptive ADC range multipath digital microphone system of FIG. 6 can further comprise one or more gain compensation components 618, 620, each associated with one of the digital audio signals (e.g., via one or more digital audio filters (e.g., decimation filter, low pass filter, etc.) 612 and 614) having different scaling factors, in a non-limiting aspect. In further non-limiting embodiments, exemplary ADC range control component 616 can be further configured to adjust gain of one or more of the gain compensation components 618, 620 on a continuous basis to compensate for a change in the gain of the exemplary adaptive ADCs 608, 610.

In still further non-limiting aspects, exemplary adaptive ADC range multipath digital microphone system of FIG. 6 can further comprise a digital data path configured to avoid audible artifacts during gain and/or path changes. For instance, exemplary adaptive ADC range multipath digital microphone system of FIG. 6 can further comprise an exemplary glitch removal component 622 configured to minimize audible artifacts associated with the change in the gain of the exemplary adaptive ADCs 608, 610, as further described herein, for example, regarding FIG. 8. As a non-limiting example, exemplary glitch removal component can be further configured to minimize audible artifacts via a glitch removal algorithm based on the change in the gain of the one or more of the adaptive ADCs determined by the ADC range control component. For instance, exemplary glitch removal component can be further configured to minimize audible artifacts via the glitch removal algorithm comprising one or more of zero-crossing detection, filtering, or signal prediction, in a non-limiting aspect. Further non-limiting examples of exemplary glitch removal algorithms are described below, regarding FIG. 8, for example. Exemplary adaptive ADC range multipath digital microphone system of FIG. 6 further depicts signal paths in-lo[k] 624, in-hi[k] 626, in-hi_selected[k] 628, and clk_div_by_8(t) 630, as further described herein, for example, regarding FIGS. 7, 9, etc.

In still further non-limiting aspects, exemplary adaptive ADC range multipath digital microphone system of FIG. 6 can comprise a multiplexing component that can be configured to switch from conveying a digital audio signal associated with the one or more of the adaptive ADCs and another digital audio signal associated with another of the one or more adaptive ADCs, as further described herein.

In addition, exemplary adaptive ADC range multipath digital microphone system of FIG. 6 can comprise an output component that can be configured to transmit a digital signal based on the one or more digital audio signals comprising one or more of a pulse-density modulation (PDM) signal, an integrated interchip sound ($I^2S$) signal, a time-division multiplexed signal, or a Soundwire signal, as further described herein. For instance, an exemplary output component can comprise one or more of a nonlinear compensation component, a filtering component, digital gain adjust component, or a signal reshaper component, according to still further non-limiting aspects.

As described above, the terms adaptive ADC, and so on, can be understood to refer to one or more components that can be configured to operate and/or facilitate variable scaling factor (e.g., via a variable sampling capacitor or other component of the ADC, etc.) across the ADC from input to output that allows changing the range or gain of the ADC, depending on context. For instance, in the non-limiting example described in FIG. 6, adaptive ADC 632, 634 can refer to an ADC (e.g., a Sigma Delta modulator, etc.), such as ADCs 608, 610, in combination with a filter (e.g., a low pass filter, decimator, etc.), such as filters (e.g., decimation filter, low pass filter, etc.) 612 and 614, that facilitate variable scaling factor (e.g., via a variable sampling capacitor or other component of the ADC, etc.) across the ADC from input to output that allows changing the range or gain of the ADC. In other non-limiting examples, adaptive ADC 632, 634 can refer to or more other components (e.g., a successive approximation ADC, etc.) that facilitate variable scaling factor across the ADC from input to output that allows changing the range or gain of the ADC.

FIG. 7 depicts another functional block diagram 700 illustrating exemplary aspects of an adaptive ADC range multipath digital microphone system according to further non-limiting aspects of the subject disclosure. Exemplary adaptive ADC range multipath digital microphone system according to FIG. 7 can comprise a multi-path digital combiner component e.g., (a two-path digital combiner audio combiner component 702, etc.) such as described above regarding the non-limiting implementation of a two-path digital combiner audio combiner component 2, according to aspects of the subject disclosure. In further non-limiting aspects, exemplary multi-path digital combiner component e.g., (a two-path digital combiner audio combiner component 702, etc.) can comprise or be associated with a multiplexing component configured to switch from conveying a digital audio signal (e.g., one of in-lo[k] 624, in-hi[k] 626, etc.) associated with the one of the one or more exemplary adaptive ADCs 608, 610, and another digital audio signal (e.g., another of in-lo[k] 624, in-hi[k] 626, etc.) associated with another one of the one or more exemplary adaptive ADCs 608, 610.

Exemplary adaptive ADC range multipath digital microphone system according to FIG. 7 can further comprise an exemplary output component 704 which, can be configured to transmit a digital signal based on the plurality of digital audio signals comprising at least one of a pulse-density modulation (PDM) signal, an integrated interchip sound ($I^2S$) signal, a time-division multiplexed signal, or a Soundwire signal. In a further non-limiting aspect, exemplary output component 704 can comprise one or more of a, a filtering component (e.g., compression filter 706, etc.), digital gain adjust component (e.g., digital multiplier 708, etc.), nonlinear compensation component 710, or a signal reshaper component (e.g., Reshaper 712, etc.) to facilitate transmitting the digital signal 714.

Figure 9:
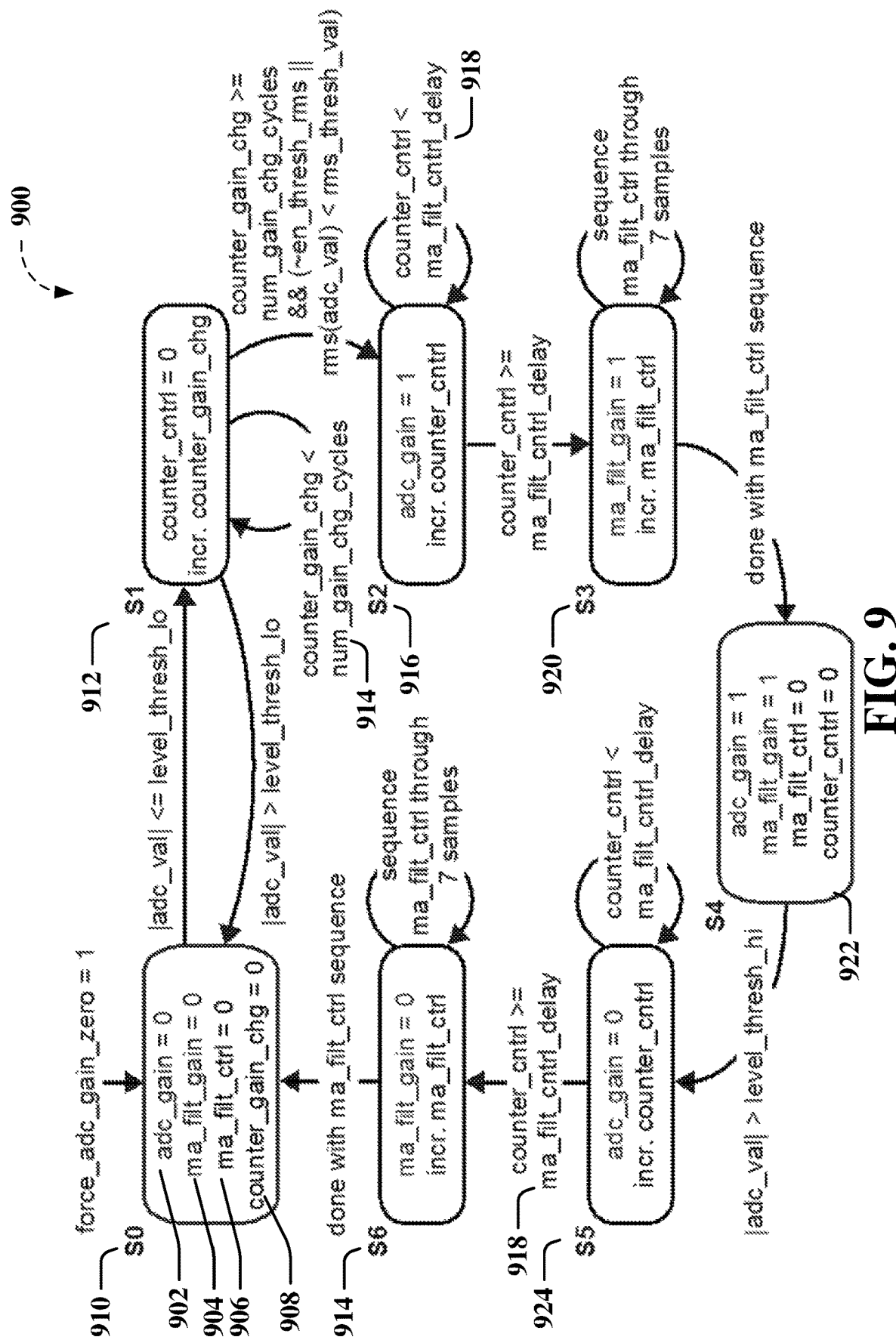
FIG. 9 depicts a non-limiting state diagram of an exemplary digital microphone system comprising an adaptive ADC configured with a non-limiting implementation of a two-path digital audio combiner component according to further aspects of the subject disclosure.

It can be understood that although various components in FIGS. 6-7 are depicted as combined, yet controlling two adaptive ADCs 608, 610 (e.g., ADC range control component 616 controlling both adaptive ADCs 608, 610), for ease of illustration, it can be appreciated that each of the two adaptive ADCs 608, 610 has its unique ADC range control state machine as further described herein, regarding FIG. 9, for example.

Figure 8:
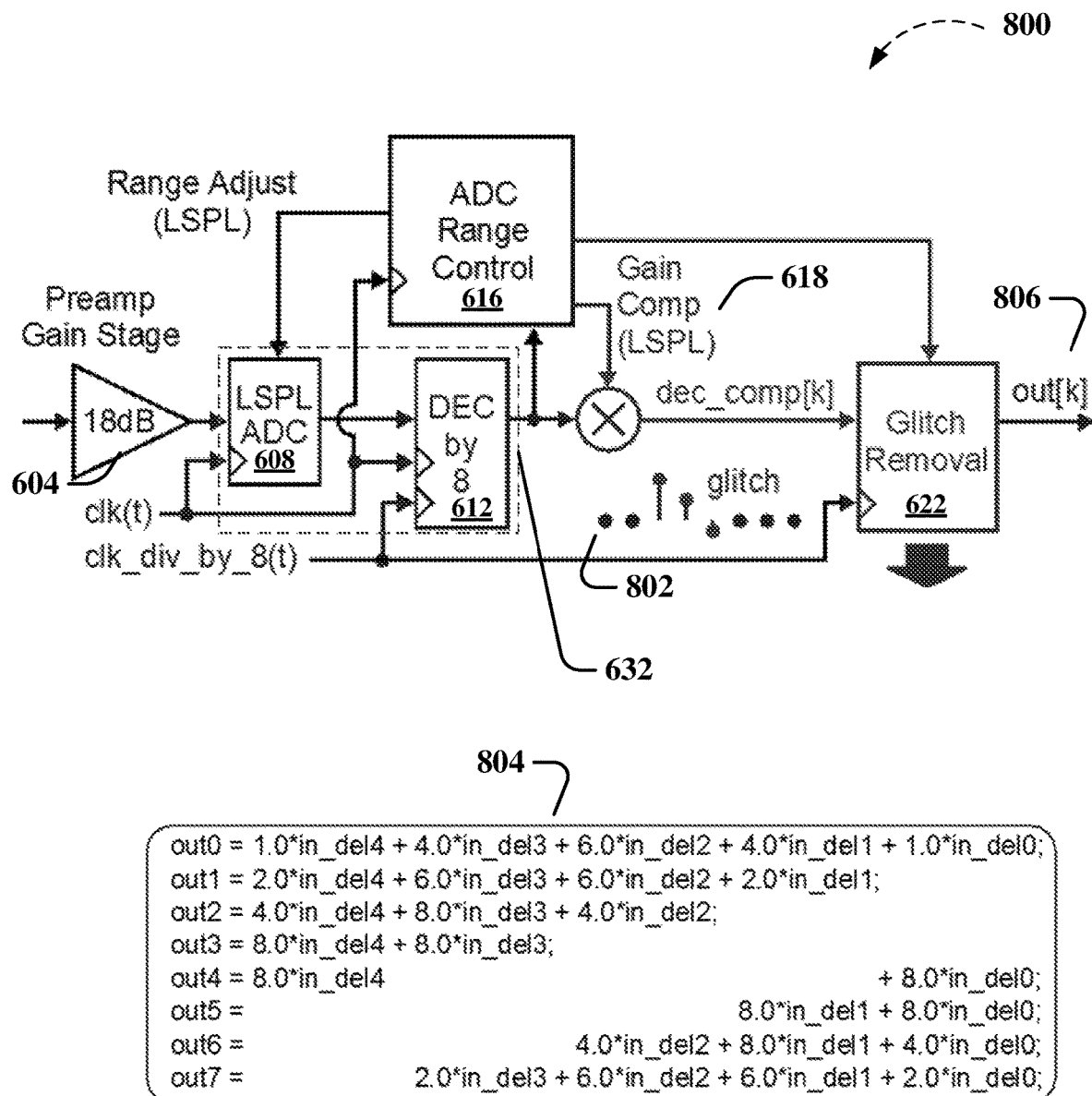
FIG. 8 depicts another functional block diagram illustrating exemplary aspects of an adaptive ADC range multipath digital microphone system according to further non-limiting aspects of the subject disclosure.

FIG. 8 depicts another functional block diagram 800 illustrating exemplary aspects of an adaptive ADC range multipath digital microphone system according to further non-limiting aspects of the subject disclosure. In various non-limiting embodiments, exemplary adaptive ADC range multipath digital microphone system can employ exemplary glitch removal component 622 configured to minimize audible artifacts associated with the change in the gain of the exemplary adaptive ADCs 608, 610, as further described herein, for example, regarding FIG. 6. In a non-limiting aspect, exemplary glitch removal component 622 can be further configured to minimize audible artifacts via an exemplary glitch removal algorithm based on the change in the gain of the exemplary adaptive ADCs 608, 610, as determined by exemplary ADC range control component 616. In further non-limiting aspects, exemplary glitch removal algorithm can comprise, include, or be based on any number of glitch removal algorithms comprising zero-crossing detection, filtering, extrapolation, etc.

Thus, FIG. 8, demonstrates an exemplary glitch removal algorithm of an exemplary glitch signal (dec_comp[k]) 802 for the purposes of illustration and not limitation, based on the non-limiting assumptions of a 2nd order, 3-bit, exemplary adaptive ADC 608 and exemplary filter (CIC4 8× decimator) 612, where the exemplary glitch signal (dec_comp[k]) 802 is modeled as the glitch being primarily confined to 3 samples at 8× decimation rate. Accordingly, an exemplary glitch removal algorithm can comprise a 5-tap FIR filter configured to process decimator output, whereby when gain change occurs in exemplary adaptive ADC 608, the exemplary glitch removal component 622 can remove the presumed 3 primary glitch samples by muxing in time filter states 804 (out0 to out7) and then back to out0 to provide an output (out[k]) 806 with exemplary glitch signal (dec_comp[k]) 802 removed, as further described below. Thus, exemplary embodiments can employ an exemplary glitch removal algorithm comprising filtering out glitch samples. As described above, other non-limiting embodiments can employ an exemplary glitch removal algorithm that can employ dynamically changing tap weights to remove glitch samples, while retaining valid signal samples. In still other non-limiting embodiments, an exemplary glitch removal algorithm can comprise employing gain changes at relatively low (e.g., approximately zero) input amplitude to avoid and/or minimize glitch signal power. In still further non-limiting embodiments, an exemplary glitch removal algorithm can employ signal predictive or prediction methods (e.g., extrapolation from valid signal values, etc.) to predict appropriate signal samples during expected glitch transients.

FIG. 9 depicts a non-limiting state diagram 900 of an exemplary digital microphone system comprising an adaptive ADC configured with a non-limiting implementation of a two-path digital audio combiner component according to further aspects of the subject disclosure. As described above, it can be understood that although various components in FIGS. 6-7 are depicted as combined, yet controlling two adaptive ADCs 608, 610 (e.g., ADC range control component 616 controlling both adaptive ADCs 608, 610), for ease of illustration, it can be appreciated that each of the two adaptive ADCs 608, 610 has its unique ADC range control state machine as further described herein. Thus, FIG. 9 demonstrates a state diagram for transitioning between gain states of the exemplary adaptive ADCs. For instance, adc_gain 902 is defined as the exemplary adaptive ADC gain where 0 denotes gain for the baseline state of exemplary adaptive ADCs (e.g., ADC gain=1 as an illustrative example), and where 1 denotes gain for the high gain state (e.g., ADC gain=2 as an illustrative example), for example, as described above regarding FIGS. 4-5.

In addition, ma_filt_gain 904 is defined as the moving average filter gain, which is the digital compensation gain (e.g., gain compensation components 618, 620, 1012, etc.) that compensates for the ADC gain, where ma_filt_gain=0 denotes a digital gain of 1, and where ma_filt_gain=1 denotes a digital gain of ½, as illustrative examples. As a further example, ma_filt_ctrl 906 controls the operation of the glitch removal algorithm whereby the glitch removal component passes through filter states 804 (out0-out7) in FIG. 8.

In another example, counter_gain_chg 908 allows a delay to be instituted before switching gain from low gain to high gain to avoid ADC saturation. For instance, if in high gain state (adc_gain=1), can instantaneously go to low gain state (adc_gain=0) to avoid ADC saturation. But if in low gain state (adc_gain=0), the system goes through a counter operation to provide a delay before going back to the high gain state (adc_gain=1), as further described below.

In the S0 state (baseline state), 910, adc_gain=0, ma_filt_gain=0, ma_filt_ctrl=0, counter_gain_chg=0). If the relevant signal is small (ladc_vall<=level_thresh_lo, where adc_val is decimated adc_val), the system can proceed to the higher gain state (adc_gain=1) to provide higher SNR.

Thus, S1 state (counter_cntrl=0; incr counter_gain_chg=0), 912, when going to state S1 from baseline state S0, (adc_gain=0), where if the signal is small (ladc_vall<=level_thresh_lo, where adc_val is decimated adc_val), the system can proceed to the higher gain state (adc_gain=1) to provide higher SNR. Thus, the system proceeds to start a counter (num_gain_chg_cycles 914) prior to switching to high gain (adc_gain=1). If you go through full number cycles for the counter, at that point the system can set the ADC gain to the higher gain state (adc_gain=1) at state S2 (adc_gain=1), 916.

However, if during the counter operation, if the signal becomes larger (ladc_vall>level_thresh_lo, then the system remains at state S0 910 in the baseline state (adc_gain=0).

S2 state 916, adc_gain=0, incr. counter_cntrl. At this point, the system starts controlling the digital compensation gain (moving average filter gain) after a delay (ma_filt_ctrl_delay 918), which can be configurable, in a non-limiting aspect. Referring again to FIGS. 6 and 7, if you have an ADC gain change via the ADC range control, it takes some time for the gain change signal to propagate through the ADC and decimator, after which the start of the glitch signal 802 will occur (some time after the ADC gain change). Thus, the system can employ ma_filt_ctrl_delay 918 to control how long after the ADC gain change that the system will start ignoring a glitch in order to avoid removing valid signal data, and instead, only removing undesired glitch samples.

After the delay (ma_filt_ctrl_delay 918) has been completed, the system starts controlling the moving average filter gain (ma_filt_gain=1) at state S3 920, to compensate for the ADC gain change (e.g., adc_gain=0 to adc_gain=1).

S3 state 920, ma_filt_gain=1, incr. ma_filt_ctrl. Glitch removal is performed as described above regarding FIG. 8, as the glitch removal component 622 sequences ma_filt_ctrl 906) through the filter states 404 (out0-out7), after which point, state S4 922 is reached.

In the S4 state (high gain state) 922, adc_gain=1, ma_filt_gain=1, ma_filt_ctrl=0, counter_gain_chg=0. As long as the signal stays low, the system stays in the high gain state (adc_gain=1). As the signal gets large and passes level_thresh_hi (e.g., ladc_vall>level_thresh_hi), the system proceeds to state S5 924, to avoid ADC saturation, where the system proceeds to the low ADC gain state (adc_gain=0).

S5 state 924, adc_gain=0, incr. counter_cntrl. At this point, the system starts controlling the digital compensation gain (moving average filter gain) after a delay (ma_filt_ctrl_delay), which can be configurable, in a non-limiting aspect, to remove the glitch properly, as described above. After the delay (ma_filt_ctrl_delay 918) has been completed, the system starts controlling the moving average filter gain (ma_filt_gain=0) at state S6 926, to compensate for the ADC gain change (e.g., adc_gain=1 to adc_gain=0).

S6 state 926, ma_filt_gain=0, incr. ma_filt_ctrl. Glitch removal is performed as described above regarding FIG. 8, as the glitch removal component 622 sequences ma_filt_ctrl 906) through the filter states 404 (out0-out7), after which point, state S0 910 is reached again, where adc_gain=0 and ma_filt_gain=0.

Figure 10:
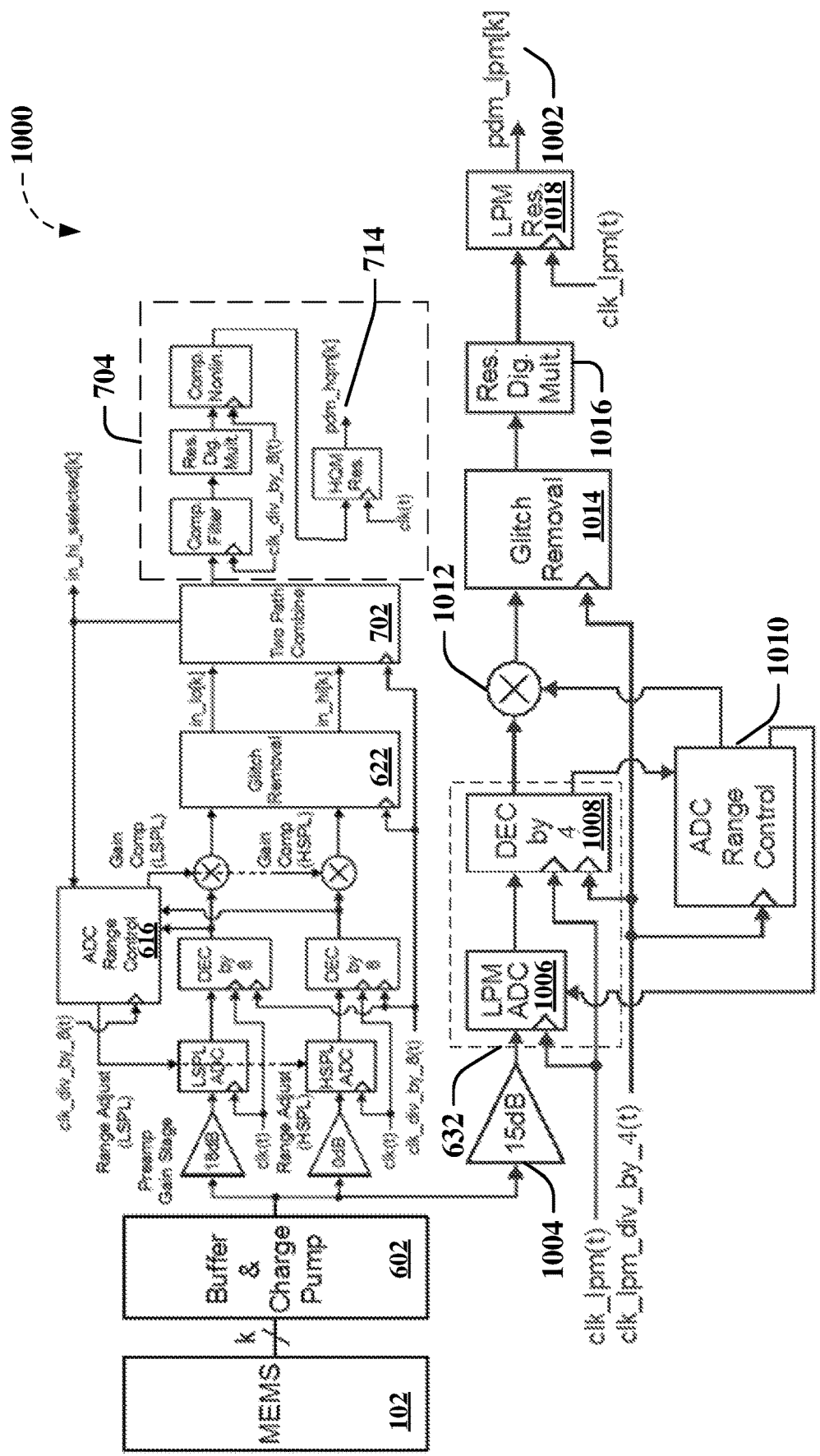
FIG. 10 depicts a functional block diagram illustrating exemplary aspects of an adaptive ADC range multipath digital microphone system according to non-limiting aspects of the subject disclosure.

FIG. 10 depicts a functional block diagram illustrating exemplary aspects of an adaptive ADC range multipath digital microphone system 1000 according to non-limiting aspects of the subject disclosure. FIG. 10 depicts the exemplary embodiment of adaptive ADC range multipath digital microphones as described above FIGS. 3-8, according to various embodiments described herein. According to further non-limiting embodiments, exemplary adaptive ADC range multipath digital microphones can provide one or more low power modes. Accordingly, one or more exemplary adaptive ADCs 608, 610 can be further configured to be placed in a low-power mode, for example, by setting of input sampling capacitance value 404 to a low-power mode capacitance value, to provide a low-power audio signal relative to power of filtered digital audio signals in normal operation, in a non-limiting aspect. In another non-limiting aspect, one or more exemplary adaptive ADCs 608, 610 or associated data paths can be switched off, etc., to further provide a low-power mode available to various non-limiting embodiments described herein.

According to still further non-limiting embodiments, exemplary adaptive ADC range multipath digital microphones can provide another low power mode comprising an exemplary alternative low-power audio path, providing a low-power audio output pdm_lpm[k] 1002, for example as depicted in FIG. 10. It can be understood that, although exemplary alternative low-power audio path is depicted as comprising one or more of an exemplary low-power amplifier or gain stage MIV, exemplary adaptive ADC 1006, exemplary filter 1008, exemplary ADC range control 1010, exemplary gain compensation component 1012, exemplary glitch removal component 1014, and so on, one or more of these components, or portions thereof may be repurposed from the data paths described above regarding FIGS. 6-8. In addition, exemplary alternative low-power audio path can further comprise one or more of a low-power gain stage (digital multiplier) 1016 and low-power data path reshape 1018. Accordingly, exemplary adaptive ADC range multipath digital microphones can provide another low power mode comprising a low-power mode adaptive ADC 1006, which can be configured to provide a second low-power mode, wherein the exemplary adaptive ADCs 608, 610 can be configured to be switched off to provide the second low-power mode.

Figure 11:
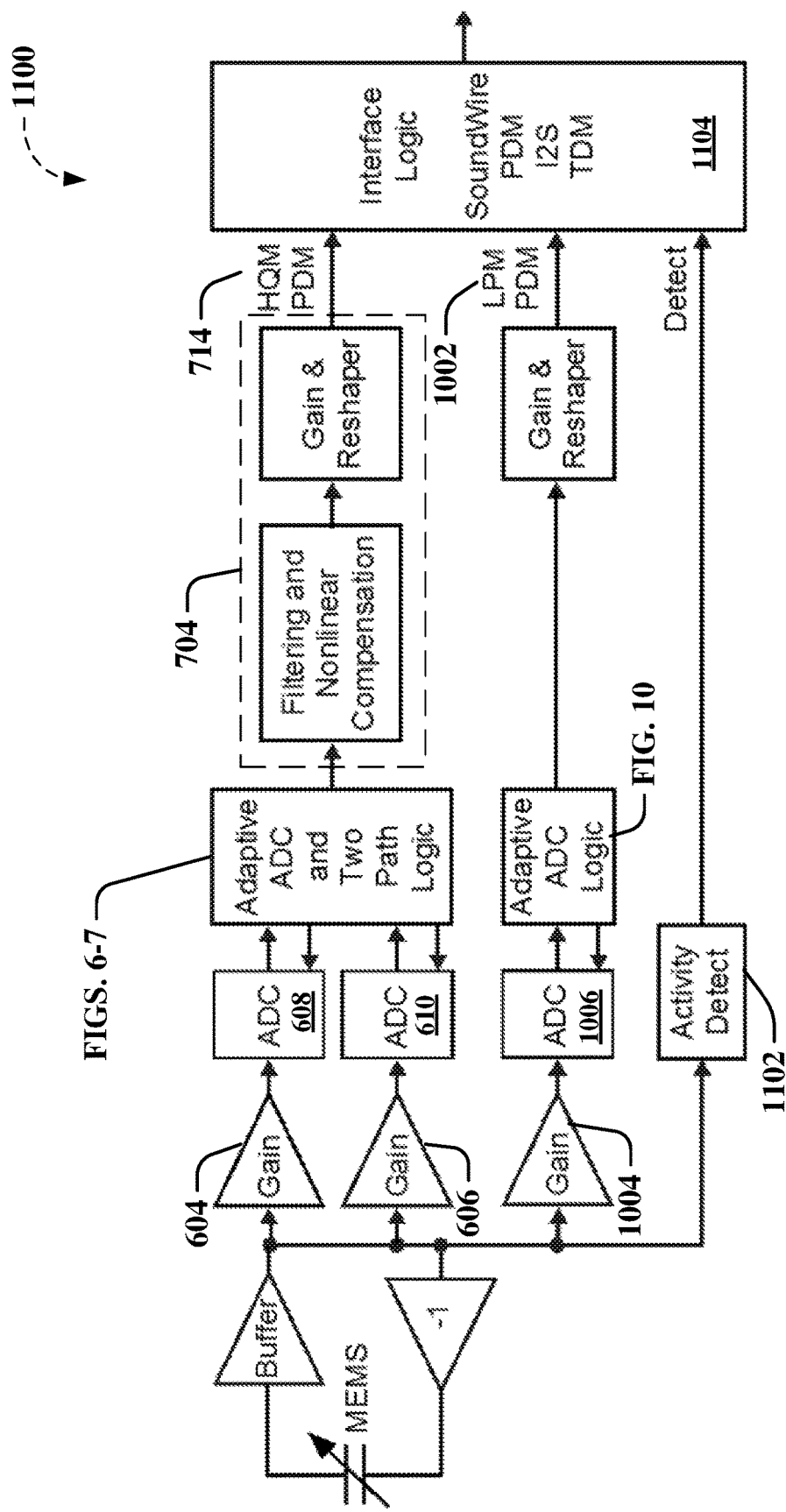
FIG. 11 depicts another functional block diagram illustrating exemplary aspects of an adaptive ADC range multipath digital microphone system according to further non-limiting aspects of the subject disclosure.

FIG. 11 depicts another functional block diagram illustrating exemplary aspects of an adaptive ADC range multipath digital microphone system 1100 according to further non-limiting aspects of the subject disclosure. As a non-limiting example, in addition to various components described herein, regarding 3-8, 10, etc. exemplary adaptive ADC range multipath digital microphone system 1100 can comprise an activity detection component 1102 configured to provide an indication of the absence of audio activity, and an output component 1104 configured to determine whether to transmit a digital signal based the absence of audio activity a low power audio signal (e.g., via exemplary low-power audio signal data path of FIG. 10, etc.), wherein the digital signal comprises at least one of a pulse-density modulation (PDM) signal, an integrated interchip sound (I$^2$S) signal, a time-division multiplexed signal, or a Soundwire signal. In a further non-limiting aspect, the output component comprises at least one of a nonlinear compensation component, a filtering component, or a signal reshaper component, as further described herein.

Accordingly, exemplary adaptive ADC range multipath digital microphone system 1100 can comprise a first circuit having at least one input operatively couplable to at least one MEMS acoustic sensor to receive, via the input, at least one electrical signal that varies in accordance with at least one acoustic signal, the first circuit having at least one output (e.g., at one or more of exemplary low-power gain stages 604, 606, 1004) and being configured to process the at least one electrical signal and configured to provide at least one corresponding processed electrical signal at the at least one output.

Accordingly, exemplary adaptive ADC range multipath digital microphone system 1100 can comprise a first circuit having at least one input operatively couplable to at least one MEMS acoustic sensor to receive, via the input, at least one electrical signal that varies in accordance with at least one acoustic signal, the first circuit having at least one output (e.g., at one or more of exemplary low-power gain stages 604, 606, 1004) and being configured to process the at least one electrical signal and configured to provide at least one corresponding processed electrical signal at the at least one output, in a non-limiting aspect.

Exemplary adaptive ADC range multipath digital microphone system 1100 can further comprise one or more amplifiers (e.g., one or more of exemplary low-power gain stages 604, 606, 1004) operatively coupled to the at least one output, wherein the one or more amplifiers can be configured to receive the at least one corresponding processed electrical signal, and wherein the one or more amplifiers can be configured to apply one or more first scaling factors to the at least one corresponding processed electrical signal, in another non-limiting aspect.

Exemplary adaptive ADC range multipath digital microphone system 1100 can further comprise one or more exemplary adaptive ADCs (e.g., one or more exemplary adaptive ADCs 608, 610, 1006), each operatively coupled to one of one or more outputs associated with the one or more amplifiers, and each configured to provide a respective one of one or more digital audio signals having different scaling factors associated with the at least one acoustic signal, in a further non-limiting aspect. In a further non-limiting aspect, the one or more adaptive ADCs can be configured to be gain adjusted by the ADC range control component via a change from one of one or more input sampling capacitance values of an associated one of the one or more adaptive ADCs to another one of the one or more input sampling capacitance values of the associated one of the one or more adaptive ADCs according to an ADC range control algorithm, as further described herein. In a another non-limiting aspect, the one or more adaptive ADCs can be further configured to be placed in a first low-power mode (e.g., reduced sampling rate, reduced power amplifier, changed sampling capacitance, etc.). Exemplary adaptive ADC range multipath digital microphone system 1100 can further comprise a low-power mode adaptive ADC (e.g., exemplary adaptive ADCs 1006) of the one or more adaptive ADCs configured to provide a second low-power mode, wherein the one or more adaptive ADCs other than the low-power mode adaptive ADC can be further configured to be switched off to provide the second low-power mode.

Exemplary adaptive ADC range multipath digital microphone system 1100 can further comprise one or more digital audio filters (e.g., one or more filters 612, 614, 1008), each operatively coupled to one of the one or more adaptive ADCs, each configured to receive the respective one of the one or more digital audio signals having different scaling factors, and configured to provide one or more filtered digital audio signals, in a non-limiting aspect. In a further non-limiting aspect, the one or more digital audio filters comprise at least one of one or more decimators or one or more low pass filters, as further described herein.

Exemplary adaptive ADC range multipath digital microphone system 1100 can further comprise an ADC range control component (e.g., ADC range control component 616, 1010, etc.) configured to adjust gain of at least one of the one or more adaptive ADCs based at least in part on a respective sound pressure level threshold being sensed in at least one of the one or more filtered digital audio signals, in another non-limiting aspect.

Exemplary adaptive ADC range multipath digital microphone system 1100 can further comprise one or more gain compensation components (e.g., one or more gain compensation component 618, 620, 1012, etc.), each associated with one of the one or more filtered digital audio signals, wherein the ADC range control component is further configured to adjust gain of at least one of the gain compensation components on a continuous basis to compensate for a change in the gain of the at least one of the one or more of the adaptive ADCs, in a further non-limiting aspect.

Exemplary adaptive ADC range multipath digital microphone system 1100 can further comprise a glitch removal component (e.g., glitch removal component 622, 1014, etc) configured to minimize audible artifacts associated with the change in the gain of the at least one of the one or more of the adaptive ADCs, in a non-limiting aspect. In a further non-limiting aspect, the glitch removal component is further configured to minimize audible artifacts via a glitch removal algorithm based on the change in the gain of the at least one of the one or more of the adaptive ADCs determined by the ADC range control component, as further described herein. In another non-limiting aspect, the glitch removal component is further configured to minimize audible artifacts via the glitch removal algorithm comprising at least one of zero-crossing detection, filtering, or signal prediction, as further described herein.

Exemplary adaptive ADC range multipath digital microphone system 1100 can further comprise a multiplexing component (not shown, e.g., a multiplexing component of a multipath digital audio combiner component 210, 710, comprised in output component 1104, etc.) configured to switch from conveying one of the digital audio signals associated with the at least one of the one or more adaptive ADCs and another digital audio signal associated with another of the one or more adaptive, in a further non-limiting aspect.

As described herein, various alternatives to the described embodiments are contemplated by the subject disclosure, in non-limiting aspects. For instance, one or more of the described embodiments can be employed with one or more other sensors, including but not limited to, acoustic sensors (e.g., microphones, ultrasonic sensors, etc.), environmental sensors (e.g., pressure sensors, temperature sensors, gas sensors, etc.) motion sensors (e.g., accelerometers, gyroscopes, etc.), and so on. Other non-limiting alternative embodiments contemplate employing adaptive ADC as described herein via a successive approximation ADC. In still further non-limiting alternative embodiments, one or more other components can be substituted for functional equivalents and/or various aspects of adaptive ADC as described herein can be employed in other designs specified, which can employ a subset of the various non-limiting aspects described herein.

Figure 12:
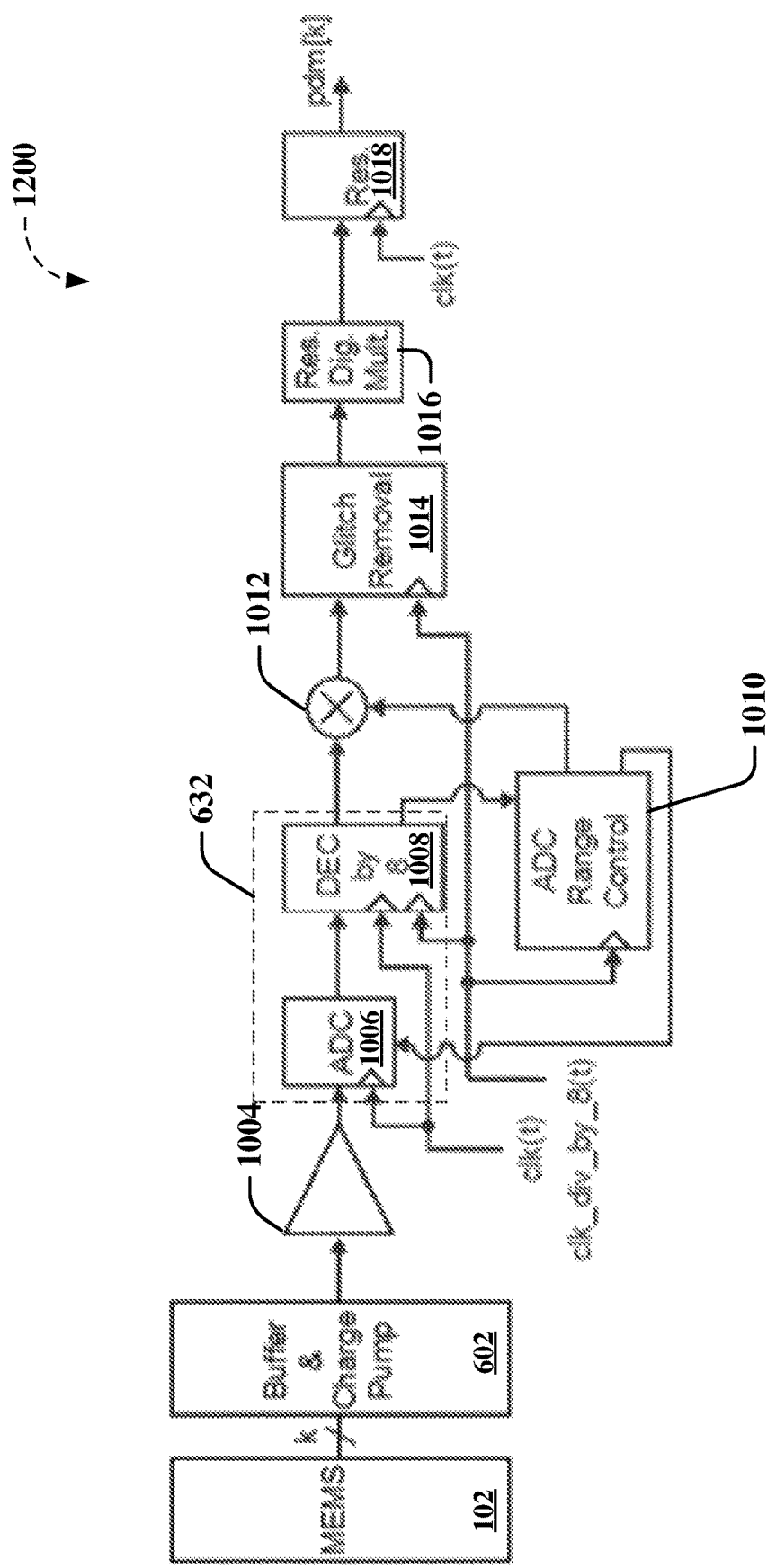
FIG. 12 depicts a functional block diagram illustrating exemplary aspects of an adaptive ADC range digital microphone according to non-limiting aspects of the subject disclosure.

For instance, FIG. 12 depicts a functional block diagram 1200 illustrating exemplary aspects of an adaptive ADC range digital microphone according to non-limiting aspects of the subject disclosure. The various components depicted in FIG. 12 can be understood by reference to the components described above regarding FIGS. 6-11. Accordingly, it can be understood from FIG. 12 that an exemplary digital microphone (or one or more other sensor s) can employ adaptive ADC range, where it is desired to facilitate a variable scaling factor across the ADC from input to output that allows changing the range or gain of the ADC. By comparison to FIG. 10, it is noted that the illustrative embodiment of FIG. 12 is not necessarily referred to as a low power audio path, although it may be in particular embodiments, as it lacks another signal path for comparison of relative power levels. Note further that, whereas the exemplary embodiment of FIG. 10 depicts exemplary filter 1008 (e.g., decimation by 4), the exemplary embodiment of FIG. 12 depicts exemplary filter 1008 (e.g., decimation by 8), in a non-limiting aspect. In other non-limiting aspects of FIG. 12, adaptive ADC 632 can further refer to or more other components (e.g., a successive approximation ADC, etc.) that facilitate variable scaling factor across the ADC from input to output that allows changing the range or gain of the ADC, as further described herein. Note further that exemplary gain stage 1004 is not specified as compared to FIG. 10, and is subject to design requirements, in a non-limiting aspect.

Thus, in further non-limiting embodiments, an exemplary adaptive ADC range digital microphone can comprise an adaptive ADC that can be configured to generate a digital audio signal having different scaling factors of an associated audio signal, as described herein. In a non-limiting aspect, the adaptive ADC can be configured to be gain adjusted by the ADC range control component via a change from one of a plurality of input sampling capacitance values of the adaptive ADC to another one of the plurality of input sampling capacitance values of the adaptive ADC according to an ADC range control algorithm, as further described herein. In further non-limiting embodiments, the adaptive ADC can comprise a sigma delta modulator configured as an ADC or a successive approximation ADC, as described above.

In still further non-limiting embodiments, an exemplary adaptive ADC range digital microphone can further comprise a gain compensation component associated with the digital audio signal having different scaling factors, wherein the ADC range control component is further that can be configured to adjust gain of the gain compensation component on a continuous basis to compensate for a change in the gain of the adaptive ADC, as further described herein.

In further non-limiting embodiments, an exemplary adaptive ADC range digital microphone can further comprise an ADC range control component that can be configured to adjust gain of the adaptive ADC based on a respective sound pressure level threshold being sensed in the digital audio signal having different scaling factors.

In addition, and other non-limiting embodiments, an exemplary adaptive ADC range digital microphone can further comprise a glitch removal component that can be configured to minimize audible artifacts associated with the change in the gain of the adaptive ADC as described herein. In another non-limiting aspect, an exemplary glitch removal component can be further configured to minimize audible artifacts via a glitch removal algorithm based on the change in the gain of the adaptive ADC determined by the ADC range control component, as described above. In still further non-limiting aspects, an exemplary glitch removal component can be further configured to minimize audible artifacts via the glitch removal algorithm comprising one or more of zero-crossing detection, filtering, or signal prediction, as described herein.

In other non-limiting embodiments, an exemplary adaptive ADC range digital microphone can further comprise a digital audio filter, operatively coupled to the sigma delta modulator configured as the ADC, that can be configured to receive the digital audio signal having different scaling factors of the associated audio signal, and that can be configured to provide a filtered digital audio signal, as further described herein. For instance, an exemplary digital audio filter can comprise one or more of a decimator or a low pass filter, in a further non-limiting aspect.

In still other non-limiting embodiments, an exemplary adaptive ADC range digital microphone can further comprise an output component that can be configured to transmit a digital signal based on the digital audio signal comprising one or more of a pulse-density modulation (PDM) signal, an integrated interchip sound (I²S) signal, a time-division multiplexed signal, or a Soundwire signal, as further described herein. In another non-limiting aspect, an exemplary output component can comprise one or more of a nonlinear compensation component, a filtering component, digital gain adjust component, or a signal reshaper component, as described above.

Figure 13:
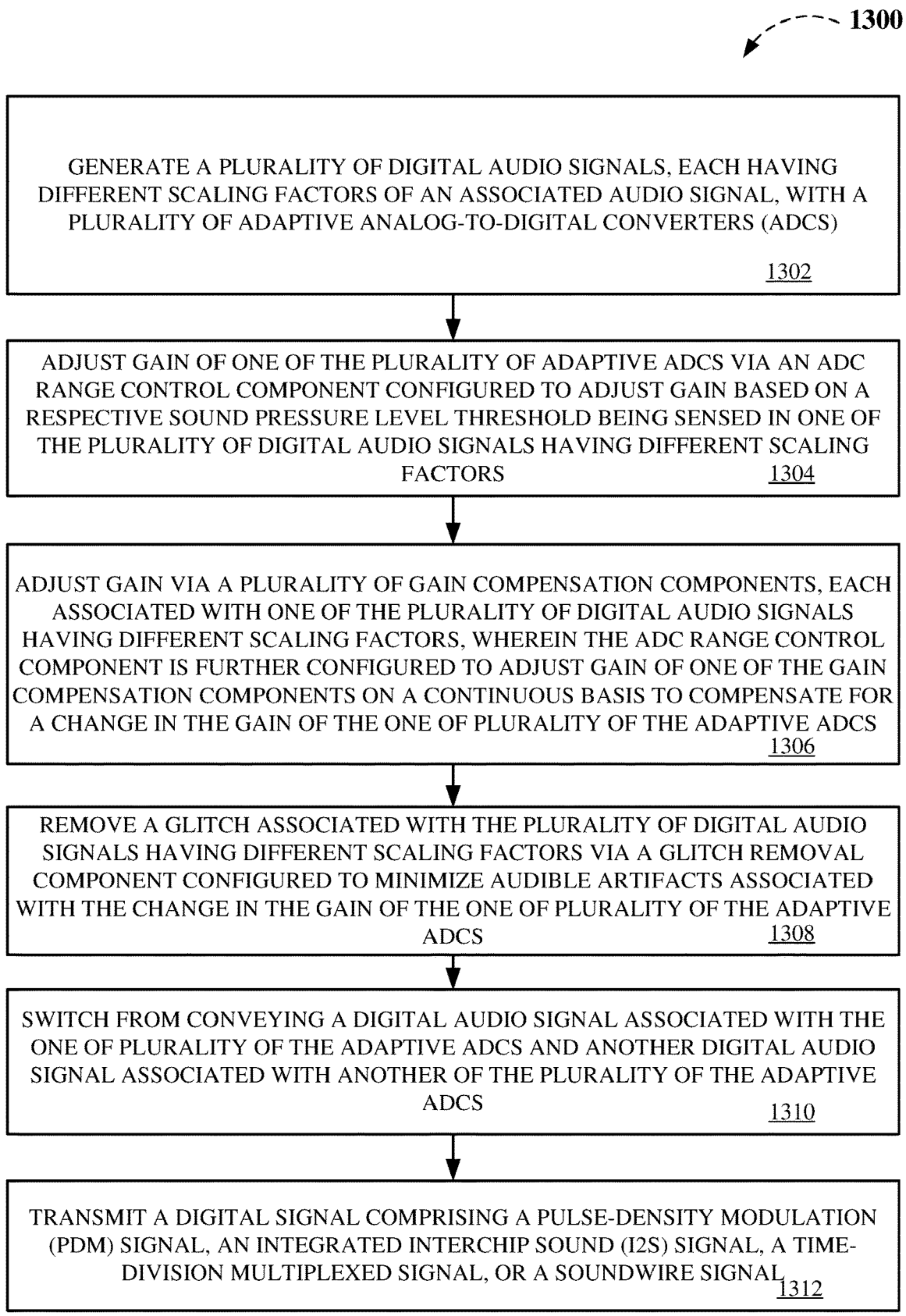
FIG. 13 depicts an exemplary flowchart of non-limiting methods associated with various non-limiting embodiments of the subject disclosure.
Figure 14:
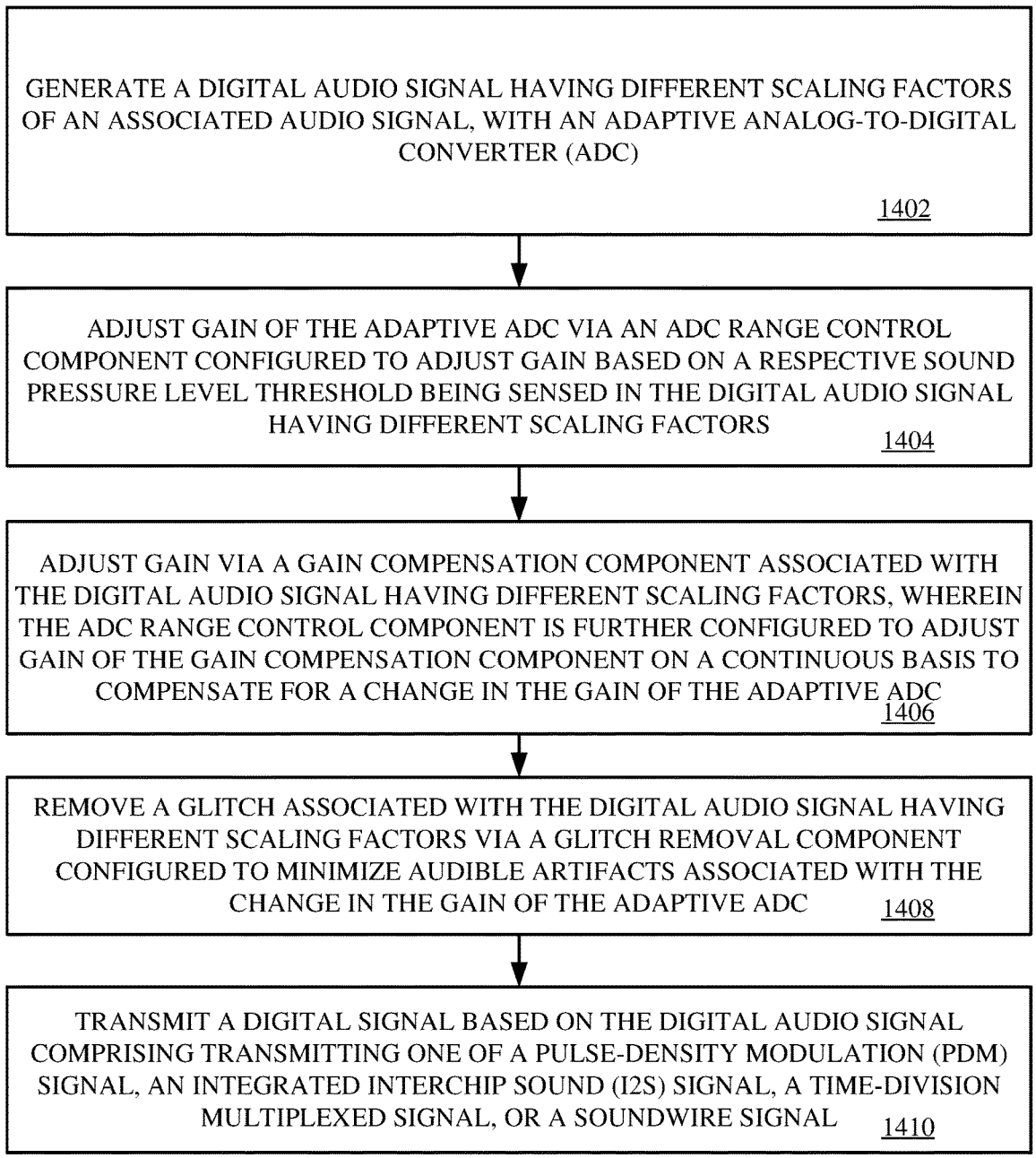
FIG. 14 depicts another exemplary flowchart of further non-limiting methods associated with various non-limiting embodiments of the subject disclosure.

In view of the subject matter described supra, methods that can be implemented in accordance with the subject disclosure will be better appreciated with reference to the flowchart of FIGS. 13-14. While for purposes of simplicity of explanation, the methods are shown and described as a series of blocks, it is to be understood and appreciated that such illustrations or corresponding descriptions are not limited by the order of the blocks, as some blocks may occur in different orders and/or concurrently with other blocks from what is depicted and described herein. Any non-sequential, or branched, flow illustrated via a flowchart should be understood to indicate that various other branches, flow paths, and orders of the blocks, can be implemented which achieve the same or a similar result. Moreover, not all illustrated blocks may be required to implement the methods described hereinafter.

Exemplary Methods

FIG. 13 depicts an exemplary flowchart of non-limiting methods 1300 associated with various non-limiting embodiments of the subject disclosure.

Exemplary methods 1300 can comprise, at 1302, generating one or more digital audio signals, each having different scaling factors of an associated audio signal, with one or more adaptive analog-to-digital converters (ADCs), as further described herein. In a non-limiting aspect, the generating the one or more digital audio signals can comprise generating the one or more digital audio signals with another adaptive ADC of the one or more adaptive ADCs configured to provide a low power audio signal relative to power of the one or more digital audio signals having different scaling factors, as further described herein. In a further non-limiting aspect, generating the one or more digital audio signals can comprise generating the one or more digital audio signals with at least one of the one or more adaptive ADCs comprising one or more sigma delta modulators configured as ADCs or one or more successive approximation ADCs, as further described herein.

Exemplary methods 1300 can further comprise, at 1304, adjusting gain of at least one of the one or more adaptive ADCs via an ADC range control component configured to adjust gain based on a respective sound pressure level threshold being sensed in at least one of the one or more digital audio signals having different scaling factors, as further described herein. In a further non-limiting aspect, the adjusting gain of the at least one of the one or more adaptive ADCs via the ADC range control component can comprise adjusting gain of the at least one of the one or more adaptive ADCs by the ADC range control component via a change from one of one or more input sampling capacitance values of an associated one of the one or more adaptive ADCs to another one of the one or more input sampling capacitance values of the associated one of the one or more adaptive ADCs according to an ADC range control algorithm, as further described herein.

Exemplary methods 1300 can comprise, at 1306, adjusting gain via one or more gain compensation components, each associated with one of the one or more digital audio signals having different scaling factors, wherein the ADC range control component can be further configured to adjust gain of at least one of the gain compensation components on a continuous basis to compensate for a change in the gain of the at least one of the one or more adaptive ADCs, as further described herein.

In other non-limiting embodiments, exemplary methods 1300 can comprise, at 1308, removing at least one glitch associated with the one or more digital audio signals having different scaling factors via a glitch removal component configured to minimize audible artifacts associated with the change in the gain of the at least one of the one or more adaptive ADCs. In a further non-limiting aspect, removing at least one glitch associated with the one or more digital audio signals having different scaling factors via a glitch removal component can comprise removing at least one glitch according to a glitch removal algorithm based on the change in the gain of the at least one of the one or more adaptive ADCs determined by the ADC range control component, as further described herein. In a another non-limiting aspect, removing the at least one glitch can comprise removing the at least one glitch according to the glitch removal algorithm comprising at least one of zero-crossing detection, filtering, or signal prediction, as further described herein.

Exemplary methods 1300 can comprise, at 1310, switching from conveying a digital audio signal associated with the at least one of the one or more adaptive ADCs and another digital audio signal associated with another of the one or more adaptive ADCs, as further described herein.

Exemplary methods 1300 can further comprise, at 1312, transmitting a digital signal based on the one or more digital audio signals comprising transmitting at least one of a pulse-density modulation (PDM) signal, an integrated interchip sound (I²S) signal, a time-division multiplexed signal, or a Soundwire signal. In a further non-limiting aspect, transmitting the digital signal can comprise transmitting the digital signal via at least one of a nonlinear compensation component, a filtering component, digital gain adjust component, or a signal reshaper component, as further described herein.

Exemplary methods 1300 can further comprise, placing the one or more adaptive ADCs in a first low-power mode (e.g., reduced sampling rate, reduced power amplifier, changed sampling capacitance, etc.). In addition, exemplary methods 1300 can further comprise, placing the one or more adaptive ADCs in a second low-power mode comprising selecting a low-power mode adaptive ADC of the one or more adaptive ADCs configured to provide the second low-power mode, wherein the one or more adaptive ADCs other than the low-power mode adaptive ADC can be further configured to be switched off to provide the second low-power mode.

In addition, exemplary methods 1300 can further comprise receiving the one or more digital audio signals with one or more digital audio filters, each operatively coupled to one of the one or more sigma delta modulators configured as ADCs, wherein the one or more digital audio filters can be configured to receive one of the one or more digital audio signals having different scaling factors of the associated audio signal and configured to provide one or more filtered digital audio signals. In a further non-limiting aspect, receiving the one or more digital audio signals with the one or more digital audio filters can comprise receiving the one or more digital audio signals with at least one of one or more decimators or one or more low pass filters, as further described herein.

FIG. 14 depicts another exemplary flowchart of further non-limiting methods 1300 associated with various non-limiting embodiments of the subject disclosure.

Exemplary methods 1400 can comprise, at 1402, generating a digital audio signal having different scaling factors of an associated audio signal, with an adaptive analog-to-digital converter (ADC), as further described herein. In a non-limiting aspect, generating the digital audio signal can comprise generating the digital audio signal with the adaptive ADC comprising a sigma delta modulator configured as an ADC or a successive approximation ADC, as further described herein.

Exemplary methods 1400 can further comprise, at 1404, adjusting gain of the adaptive ADC via an ADC range control component configured to adjust gain based at least in part on a respective sound pressure level threshold being sensed in the digital audio signal having different scaling factors, as further described herein. In a further non-limiting aspect, adjusting gain of the adaptive ADC via the ADC range control component can comprise adjusting gain of the adaptive ADC by the ADC range control component via a change from one of a plurality of input sampling capacitance values of the adaptive ADC to another one of the plurality of input sampling capacitance values of the adaptive ADC according to an ADC range control algorithm, as further described herein.

Exemplary methods 1400 can comprise, at 1406, adjusting gain via a gain compensation component associated with the digital audio signal having different scaling factors, wherein the ADC range control component can be further configured to adjust gain of the gain compensation component on a continuous basis to compensate for a change in the gain of the adaptive ADC, as further described herein.

In other non-limiting embodiments, exemplary methods 1400 can comprise, at 1408, removing at least one glitch associated with the digital audio signal having different scaling factors via a glitch removal component configured to minimize audible artifacts associated with the change in the gain of the adaptive ADC. In a further non-limiting aspect, removing at least one glitch associated with the digital audio signal having different scaling factors via a glitch removal component can comprise removing at least one glitch according to a glitch removal algorithm based on the change in the gain of the adaptive ADC determined by the ADC range control component, as further described herein. In another non-limiting aspect, removing the at least one glitch can comprise removing the at least one glitch according to the glitch removal algorithm comprising at least one of zero-crossing detection, filtering, or signal prediction, as further described herein.

Exemplary methods 1400 can further comprise, at 1410, transmitting a digital signal based on the digital audio signal comprising transmitting at least one of a pulse-density modulation (PDM) signal, an integrated interchip sound ($I^2S$) signal, a time-division multiplexed signal, or a Soundwire signal. In a further non-limiting aspect, transmitting the digital signal can comprise transmitting the digital signal via at least one of a nonlinear compensation component, a filtering component, digital gain adjust component, or a signal reshaper component, as further described herein.

In addition, exemplary methods 1400 can further comprise receiving the digital audio signal with a digital audio filter operatively coupled to the sigma delta modulator configured as the ADC, wherein the digital audio filter can be configured to receive the digital audio signal having different scaling factors of the associated audio signal and configured to provide a filtered digital audio signal. In a further non-limiting aspect, receiving the digital audio signal with the digital audio filter can comprise receiving the digital audio signal with at least one of a decimator or a low pass filter, as further described herein.

What has been described above includes examples of the embodiments of the subject disclosure. It is, of course, not possible to describe every conceivable combination of configurations, components, and/or methods for purposes of describing the claimed subject matter, but it is to be appreciated that many further combinations and permutations of the various embodiments are possible. Accordingly, the claimed subject matter is intended to embrace all such alterations, modifications, and variations that fall within the spirit and scope of the appended claims. While specific embodiments and examples are described in subject disclosure for illustrative purposes, various modifications are possible that are considered within the scope of such embodiments and examples, as those skilled in the relevant art can recognize.

As used in this application, the terms "component," "module," "device" and "system" are intended to refer to a computer-related entity, either hardware, a combination of hardware and software, software, or software in execution. As one example, a component or module can be, but is not limited to being, a process running on a processor, a processor or portion thereof, a hard disk drive, multiple storage drives (of optical and/or magnetic storage medium), an object, an executable, a thread of execution, a program, and/or a computer. By way of illustration, both an application running on a server and the server can be a component or module. One or more components or modules scan reside within a process and/or thread of execution, and a component or module can be localized on one computer or processor and/or distributed between two or more computers or processors.

As used herein, the term to "infer" or "inference" refer generally to the process of reasoning about or inferring states of the system, and/or environment from a set of observations as captured via events, signals, and/or data. Inference can be employed to identify a specific context or action, or can generate a probability distribution over states, for example. The inference can be probabilistic—that is, the computation of a probability distribution over states of interest based on a consideration of data and events. Inference can also refer to techniques employed for composing higher-level events from a set of events and/or data. Such inference results in the construction of new events or actions from a set of observed events and/or stored event data, whether or not the events are correlated in close temporal proximity, and whether the events and data come from one or several event and data sources.

In addition, the words "example" or "exemplary" is used herein to mean serving as an example, instance, or illustration. Any aspect or design described herein as "exemplary" is not necessarily to be construed as preferred or advantageous over other aspects or designs. Rather, use of the word, "exemplary," is intended to present concepts in a concrete fashion. As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

In addition, while an aspect may have been disclosed with respect to only one of several embodiments, such feature may be combined with one or more other features of the other embodiments as may be desired and advantageous for any given or particular application. Furthermore, to the extent that the terms "includes," "including," "has," "contains," variants thereof, and other similar words are used in either the detailed description or the claims, these terms are intended to be inclusive in a manner similar to the term "comprising" as an open transition word without precluding any additional or other elements.

What is claimed is:

1. An apparatus, comprising:
    a plurality of adaptive analog-to-digital converters (ADCs), configured to generate one of a plurality of digital audio signals having different scaling factors of an associated audio signal;
    an ADC range control component configured to adjust gain of at least one of the plurality of adaptive ADCs based at least in part on a respective sound pressure level threshold being sensed in at least one of the plurality of digital audio signals having different scaling factors;
    a plurality of gain compensation components, each associated with one of the plurality of digital audio signals having different scaling factors, wherein the ADC range control component is further configured to adjust gain of at least one of the gain compensation components on a continuous basis to compensate for a change in the gain of the at least one of plurality of the adaptive ADCs; and
    a glitch removal component configured to minimize audible artifacts associated with the change in the gain of the at least one of plurality of the adaptive ADCs.

2. The apparatus of claim 1, further comprising:
    a multiplexing component configured to switch from conveying a digital audio signal associated with the at least one of plurality of the adaptive ADCs and another digital audio signal associated with another of the plurality of the adaptive ADCs.

3. The apparatus of claim 1, wherein another adaptive ADC of the plurality of adaptive ADCs is configured to provide a low-power audio signal relative to power of the plurality of digital audio signals having different scaling factors.

4. The apparatus of claim 1, wherein the plurality of adaptive ADCs are configured to be gain adjusted by the ADC range control component via a change from one of a plurality of input sampling capacitance values of an associated one of the plurality of the adaptive ADCs to another one of the plurality of input sampling capacitance values of the associated one of the plurality of the adaptive ADCs according to an ADC range control algorithm.

5. The apparatus of claim 1, wherein the plurality of adaptive ADCs are further configured to be placed in a first low-power mode.

6. The apparatus of claim 5, further comprising:
    a low-power mode adaptive ADC of the plurality of adaptive ADCs configured to provide a second low-power mode, wherein the plurality of adaptive ADCs other than the low-power mode adaptive ADC are further configured to be switched off to provide the second low-power mode.

7. The apparatus of claim 1, wherein the glitch removal component is further configured to minimize audible artifacts via a glitch removal algorithm based on the change in the gain of the at least one of plurality of the adaptive ADCs determined by the ADC range control component.

8. The apparatus of claim 7, wherein the glitch removal component is further configured to minimize audible artifacts via the glitch removal algorithm comprising at least one of zero-crossing detection, filtering, or signal prediction.

9. The apparatus of claim 1, wherein the plurality of adaptive ADCs comprises a plurality of sigma delta modulators configured as ADCs or a plurality of successive approximation ADCs.

10. The apparatus of claim 9, further comprising:
    a plurality of digital audio filters, each operatively coupled to one of the plurality of sigma delta modulators configured as ADCs, configured to receive one of the plurality of digital audio signals having different scaling factors of the associated audio signal, and configured to provide a plurality of filtered digital audio signals.

11. The apparatus of claim 10, wherein the plurality of digital audio filters comprise at least one of a plurality of decimators or a plurality of low pass filters.

12. The apparatus of claim 1, further comprising:
    an output component configured to transmit a digital signal based on the plurality of digital audio signals comprising at least one of a pulse-density modulation (PDM) signal, an integrated interchip sound ($I^2S$) signal, a time-division multiplexed signal, or a Soundwire signal.

13. The apparatus of claim 12, wherein the output component comprises at least one of a nonlinear compensation component, a filtering component, digital gain adjust component, or a signal reshaper component.

14. A method, comprising:
generating a plurality of digital audio signals, each having different scaling factors of an associated audio signal, with a plurality of adaptive analog-to-digital converters (ADCs);
adjusting gain of at least one of the plurality of adaptive ADCs via an ADC range control component configured to adjust gain based at least in part on a respective sound pressure level threshold being sensed in at least one of the plurality of digital audio signals having different scaling factors;
adjusting gain via a plurality of gain compensation components, each associated with one of the plurality of digital audio signals having different scaling factors, wherein the ADC range control component is further configured to adjust gain of at least one of the gain compensation components on a continuous basis to compensate for a change in the gain of the at least one of plurality of the adaptive ADCs; and
removing at least one glitch associated with the plurality of digital audio signals having different scaling factors via a glitch removal component configured to minimize audible artifacts associated with the change in the gain of the at least one of plurality of the adaptive ADCs.

15. The method of claim 14, further comprising:
switching from conveying a digital audio signal associated with the at least one of plurality of the adaptive ADCs and another digital audio signal associated with another of the plurality of the adaptive ADCs.

16. The method of claim 14, wherein the generating the plurality of digital audio signals comprises generating the plurality of digital audio signals with another adaptive ADC of the plurality of adaptive ADCs configured to provide a low-power audio signal relative to power of the plurality of digital audio signals having different scaling factors.

17. The method of claim 14, wherein the adjusting gain of the at least one of the plurality of adaptive ADCs via the ADC range control component comprises adjusting gain of the at least one of the plurality of adaptive ADCs by the ADC range control component via a change from one of a plurality of input sampling capacitance values of an associated one of the plurality of the adaptive ADCs to another one of the plurality of input sampling capacitance values of the associated one of the plurality of the adaptive ADCs according to an ADC range control algorithm.

18. The method of claim 14, further comprising:
placing the plurality of adaptive ADCs in a first low-power mode.

19. The method of claim 17, further comprising:
placing the plurality of adaptive ADCs in a second low-power mode comprising selecting a low-power mode adaptive ADC of the plurality of adaptive ADCs configured to provide the second low-power mode, wherein the plurality of adaptive ADCs other than the low-power mode adaptive ADC are further configured to be switched off to provide the second low-power mode.

20. The method of claim 14, wherein the removing at least one glitch associated with the plurality of digital audio signals having different scaling factors via a glitch removal component comprises removing at least one glitch according to a glitch removal algorithm based on the change in the gain of the at least one of the plurality of the adaptive ADCs determined by the ADC range control component.

21. The method of claim 20, wherein the removing the at least one glitch comprises removing the at least one glitch according to the glitch removal algorithm comprising at least one of zero-crossing detection, filtering, or signal prediction.

22. The method of claim 14, wherein the generating the plurality of digital audio signals comprises generating the plurality of digital audio signals with at least one of the plurality of adaptive ADCs comprising a plurality of sigma delta modulators configured as ADCs or a plurality of successive approximation ADCs.

23. The method of claim 22, further comprising:
receiving the plurality of digital audio signals with a plurality of digital audio filters, each operatively coupled to one of the plurality of sigma delta modulators configured as ADCs, wherein the plurality of digital audio filters are configured to receive one of the plurality of digital audio signals having different scaling factors of the associated audio signal and configured to provide a plurality of filtered digital audio signals.

24. The method of claim 23, wherein the receiving the plurality of digital audio signals with the plurality of digital audio filters comprises receiving the plurality of digital audio signals with at least one of a plurality of decimators or a plurality of low pass filters.

25. The method of claim 14, further comprising:
transmitting a digital signal based on the plurality of digital audio signals comprising transmitting at least one of a pulse-density modulation (PDM) signal, an integrated interchip sound ($I^2S$) signal, a time-division multiplexed signal, or a Soundwire signal.

26. The method of claim 25, wherein the transmitting the digital signal comprises transmitting the digital signal via at least one of a nonlinear compensation component, a filtering component, digital gain adjust component, or a signal reshaper component.

* * * * *